(12) United States Patent
An et al.

(10) Patent No.: US 11,107,867 B2
(45) Date of Patent: Aug. 31, 2021

(54) DISPLAY DEVICE AND MANUFACTURING METHOD THEREOF

(71) Applicant: Samsung Display Co., Ltd., Yongin-si (KR)

(72) Inventors: Jin Sung An, Seongnam-si (KR); Jung Hwa Kim, Gunpo-si (KR); Se Wan Son, Yongin-si (KR); Wang Woo Lee, Osan-si (KR); Ji Seon Lee, Seoul (KR); Moo Soon Ko, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/556,757

(22) Filed: Aug. 30, 2019

(65) Prior Publication Data

US 2019/0386078 A1    Dec. 19, 2019

Related U.S. Application Data

(62) Division of application No. 15/870,073, filed on Jan. 12, 2018, now Pat. No. 10,453,905.

(30) Foreign Application Priority Data

May 30, 2017    (KR) .................. 10-2017-0067033

(51) Int. Cl.
*H01L 51/56* (2006.01)
*H01L 27/32* (2006.01)
*H01L 51/52* (2006.01)

(52) U.S. Cl.
CPC ...... *H01L 27/3246* (2013.01); *H01L 27/3211* (2013.01); *H01L 27/3218* (2013.01);
(Continued)

(58) Field of Classification Search
CPC ... H01L 27/32; H01L 27/321; H01L 27/3211; H01L 27/3218; H01L 27/324;
(Continued)

(56) References Cited

U.S. PATENT DOCUMENTS 7,728,510 B2 * 6/2010 Oh .................. H01L 51/5221
                                                            313/504
8,711,138 B2    4/2014 Kawabe
(Continued)

FOREIGN PATENT DOCUMENTS

| KR | 100623716 | 9/2006 |
|---|---|---|
| KR | 1020120080473 | 7/2012 |

(Continued)

*Primary Examiner* — Monica D Harrison
(74) *Attorney, Agent, or Firm* — Cantor Colburn LLP

(57) ABSTRACT

A display device includes a substrate, a switching transistor and a driving transistor positioned on the substrate, a first electrode connected to the driving transistor, a second electrode positioned on the first electrode, and a pixel definition layer positioned between the first electrode and the second electrode, where the pixel definition layer includes a first portion, and a second portion having a thickness less than that of the first portion, where a pixel opening defined in the pixel definition layer is enclosed by the first portion, and the second portion overlaps the first electrode and the second electrode.

5 Claims, 18 Drawing Sheets

(52) U.S. Cl.
CPC ...... *H01L 27/3248* (2013.01); *H01L 27/3262* (2013.01); *H01L 51/5209* (2013.01); *H01L 51/56* (2013.01); *H01L 2227/323* (2013.01)

(58) Field of Classification Search
CPC ............. H01L 27/3246; H01L 27/3248; H01L 27/326; H01L 27/3262; H01L 21/52; H01L 21/52; H01L 21/5209; H01L 21/56; H01L 51/52; H01L 51/52; H01L 51/5209; H01L 2227/32; H01L 2227/323
USPC .......................................................... 257/40
See application file for complete search history.

(56) References Cited

U.S. PATENT DOCUMENTS

2011/0227099 A1* 9/2011 Lee ..................... H01L 27/3211
257/88
2016/0254337 A1 9/2016 Choi et al.

FOREIGN PATENT DOCUMENTS

| KR | 1020140080240 | 6/2014 |
| KR | 1020160010708 | 1/2016 |

\* cited by examiner

DISPLAY DEVICE AND MANUFACTURING METHOD THEREOF

This application is a divisional application of U.S. patent application Ser. No. 15/870,073, filed on Jan. 12, 2018, which claims priority to Korean Patent Application No. 10-2017-0067033, filed on May 30, 2017, and all the benefits accruing therefrom under 35 U.S.C. § 119, the content of which in its entirety is herein incorporated by reference.

BACKGROUND

1. Field

Exemplary embodiments of the invention relate to a display device and a manufacturing method thereof, and in detail, relate to a display device and a manufacturing method for improving element reliability.

2. Description of the Related Art

An organic light emitting diode display generally includes two electrodes and an organic emission layer interposed therebetween. Electrons injected from one electrode of the two electrodes and holes injected from the other electrode of the two electrodes are combined in the organic emission layer to generate excitons. The generated excitons are changed to a ground state from an excited state, releasing energy to emit light.

The organic light emitting diode display includes a plurality of pixels including an organic light emitting diode as a self-emissive element, and a plurality of transistors for driving the organic light emitting diode and at least one capacitor are formed in each pixel. The plurality of transistors generally includes a switching transistor and a driving transistor.

SUMMARY

In a process of elongating a number of pixels for increasing resolution of an organic light emitting diode display, an aperture ratio may decrease, a current density may increase, and a driving voltage may increase. Accordingly, there are problems that stains are generated and reliability of elements such as a thin film transistor decreases.

Exemplary embodiments provide a display device and a manufacturing method for improving element reliability.

A display device according to an exemplary embodiment includes a substrate, a switching transistor and a driving transistor positioned on the substrate, a first electrode connected to the driving transistor, a second electrode positioned on the first electrode, and a pixel definition layer positioned between the first electrode and the second electrode, and including a first portion, and a second portion having a thickness less than that of the first portion, where a pixel opening defined in the pixel definition layer is enclosed by the first portion, and the second portion overlaps the first electrode and the second electrode.

In an exemplary embodiment, the first electrode and the second electrode may overlap the first portion, the second portion, and the pixel opening of the pixel definition layer.

In an exemplary embodiment, a distance between a first portion of the first electrode overlapping the first portion of the pixel definition layer and a first portion of the second electrode may be greater than a distance between a second portion of the first electrode overlapping the second portion of the pixel definition layer and a second portion of the second electrode.

In an exemplary embodiment, a distance between a third portion of the first electrode overlapping the pixel opening of the pixel definition layer and a third portion of the second electrode may be less than the distance between the second portion of the first electrode overlapping the second portion of the pixel definition layer and the second portion of the second electrode.

In an exemplary embodiment, the first portion of the pixel definition layer may be positioned between the pixel opening and the second portion.

In an exemplary embodiment, an organic emission layer positioned between the first electrode and the second electrode may be further included.

In an exemplary embodiment, the organic emission layer may be positioned between the pixel definition layer and the second electrode.

In an exemplary embodiment, the second portion of the pixel definition layer may overlap the organic emission layer.

In an exemplary embodiment, the first electrode, the second electrode, and the organic emission layer overlap the first portion, the second portion, and the pixel opening of the pixel definition layer.

In an exemplary embodiment, the second portion of the pixel definition layer may not overlap the organic emission layer.

In an exemplary embodiment, the first electrode and the second electrode may overlap the first portion, the second portion, and the pixel opening of the pixel definition layer, and the organic emission layer may overlap the pixel opening of the pixel definition layer.

In an exemplary embodiment, the first portion of the pixel definition layer may be positioned between the pixel opening and the second portion, and may be positioned between a plurality of second portions adjacent to each other.

In an exemplary embodiment, the first portion of the pixel definition layer may not overlap the organic emission layer between the plurality of second portions adjacent to each other.

In an exemplary embodiment, the organic emission layer may include a first organic emission layer emitting a first color and a second organic emission layer emitting a second color, and the first organic emission layer and the second organic emission layer may not overlap each other.

In an exemplary embodiment, a display device according to an exemplary embodiment includes a substrate, a first electrode positioned on the substrate, a pixel definition layer positioned on the substrate and the first electrode and including a first portion, and a second portion having a thickness less than that of the first portion, an organic emission layer positioned on the first electrode, and a second electrode positioned on the organic emission layer, where a pixel opening defined in the pixel definition layer is enclosed by the first portion, and the second portion overlaps the first electrode and the second electrode.

In an exemplary embodiment, the first electrode and the second electrode may overlap the first portion, the second portion, and the pixel opening of the pixel definition layer.

In an exemplary embodiment, a distance between a first portion of the first electrode overlapping a first portion of the pixel definition layer and a first portion of the second electrode may be greater than a distance between a second portion of the first electrode overlapping the second portion of the pixel definition layer and a second portion of the second electrode.

In an exemplary embodiment, the first portion of the pixel definition layer may be positioned between the pixel opening and the second portion.

In an exemplary embodiment, the second portion of the pixel definition layer may further overlap the organic emission layer.

A manufacturing method of a display device according to an exemplary embodiment includes forming a first electrode on a substrate, forming an organic material layer on the substrate and the first electrode, patterning the organic material layer to form a pixel definition layer including a first portion, a second portion, and a pixel opening, forming an organic emission layer on the first electrode, and forming a second electrode on the organic emission layer, where the second portion has a thickness less than that of the first portion, and the second portion overlaps the first electrode and the second electrode.

In an exemplary embodiment, at least one of a slit mask and a half-tone mask may be used in the step of patterning the organic material layer.

In an exemplary embodiment, the pixel opening may be enclosed by the first portion.

In an exemplary embodiment, the first electrode and the second electrode may overlap the first portion, the second portion, and the pixel opening of the pixel definition layer.

In an exemplary embodiment, a distance between a first portion of the first electrode overlapping the first portion of the pixel definition layer and a first portion of the second electrode may be greater than a distance between a second portion of the first electrode overlapping the second portion of the pixel definition layer and a second portion of the second electrode.

In an exemplary embodiment, the first portion of the pixel definition layer may be positioned between the pixel opening and the second portion.

In an exemplary embodiment, the second portion of the pixel definition layer may further overlap the organic emission layer.

In an exemplary embodiment, the display device and the manufacturing method thereof according to the exemplary embodiments may improve element reliability.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
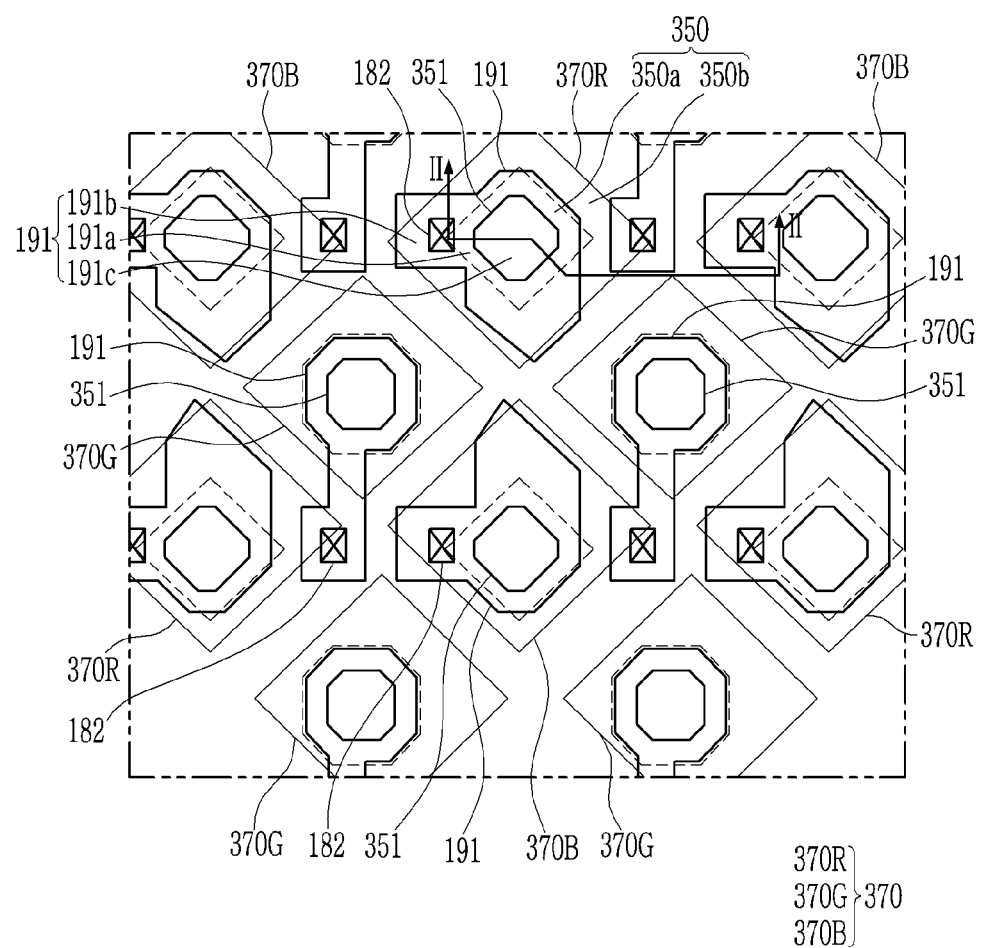
FIG. 1 is a plan view of an exemplary embodiment of a display device.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In order to clearly explain the invention, portions that are not directly related to the invention are omitted, and the same reference numerals are attached to the same or similar constituent elements throughout the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means viewing the object portion from the top, and the phrase "on a cross-section" means viewing a cross-section of which the object portion is vertically cut from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

First, the display device according to an exemplary embodiment will be described with reference to FIGS. 1 and 2.

Figure 2:
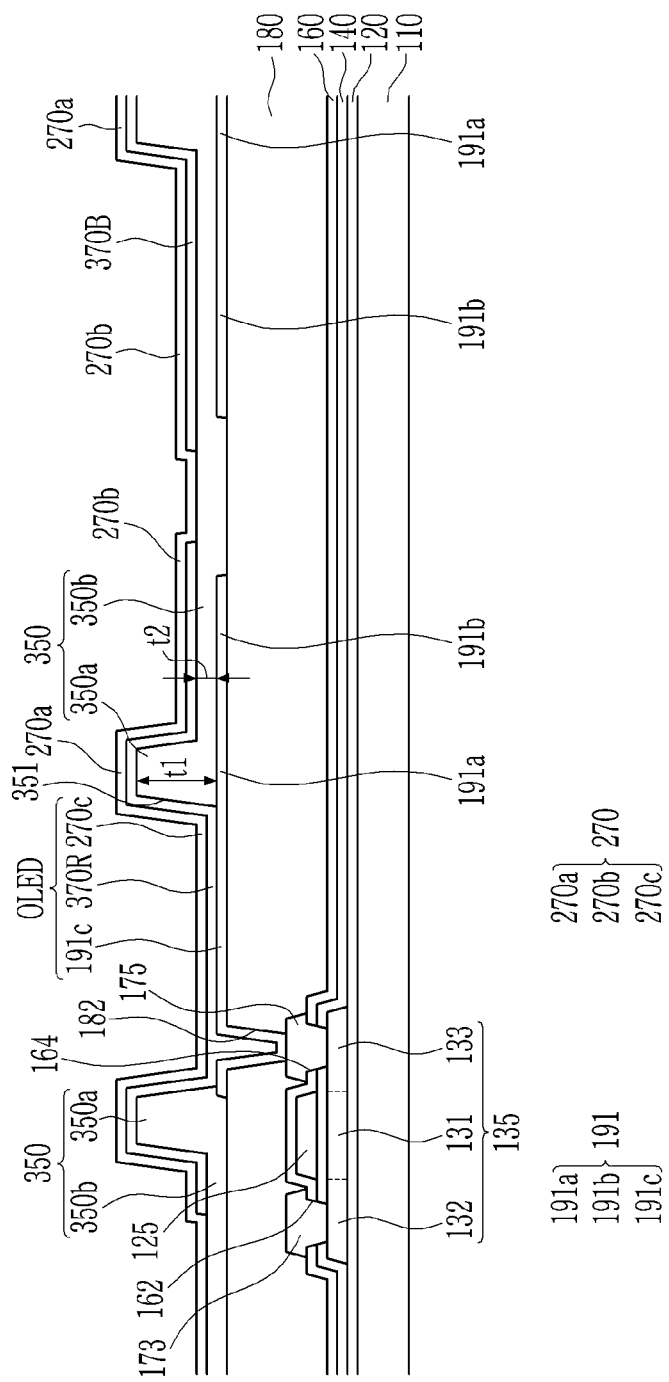
FIG. 2 is a cross-sectional view of the display device of FIG. 1 taken along line II-II.

FIG. 1 is a plan view of a display device according to an exemplary embodiment, and FIG. 2 is a cross-sectional view of the display device of FIG. 1 taken along line II-II.

As shown in FIGS. 1 and 2, the display device according to an exemplary embodiment includes a substrate 110, a first electrode 191 positioned on the substrate 110, and a second electrode 270 positioned on the first electrode 191. A pixel definition layer 350 is positioned between the first electrode 191 and the second electrode 270.

In an exemplary embodiment, the substrate 110 may be an insulating substrate including glass, quartz, ceramic, plastic, etc., or a metal substrate including stainless steel and the like. The substrate 110 may be flexible, stretchable, foldable, bendable, or rollable. As the substrate 110 may be flexible, stretchable, foldable, bendable, or rollable, the display device may also be flexible, stretchable, foldable, bendable, or rollable.

A buffer layer 120 may be positioned on the substrate 110. In an exemplary embodiment, the buffer layer 120 may be provided as a single layer of a silicon nitride (SiNx) or as a multilayer in which a silicon nitride (SiNx) and a silicon oxide (SiOx) are stacked, for example. The buffer layer 120 serves to flatten a surface while preventing undesirable materials such as impurities or moisture from permeating. In another exemplary embodiment, the buffer layer 120 may be omitted when necessary. The buffer layer 120 may be provided to cover an entire upper surface of the substrate 110.

A semiconductor 135 is positioned on the buffer layer 120. The semiconductor 135 may include a polycrystalline semiconductor material or an oxide semiconductor material. In addition, the semiconductor 135 includes a channel 131 in which impurities are not doped, and contact doping regions 132 and 133 that are positioned at opposite sides of the channel 131 and in which impurities are doped. The contact doping regions 132 and 133 include a source region 132 and a drain region 133. The impurities vary depending on a kind of the thin film transistor ("TFT").

A gate insulating layer 140 is positioned on the semiconductor 135. In an exemplary embodiment, the gate insulating layer 140 may include the inorganic insulating material such as a silicon nitride (SiNx) or a silicon oxide (SiOx).

A gate electrode 125 is positioned on the gate insulating layer 140. In this case, the gate electrode 125 overlaps at least a part of the semiconductor 135, and particularly, overlaps the channel 131. Here, the overlapping means to be overlapped in a vertical direction in a cross-sectional view.

An interlayer insulating layer 160 is positioned on the gate electrode 125 and the gate insulating layer 140. The interlayer insulating layer 160 may include the inorganic insulating material or the organic insulating material.

Contact holes 162 and 164 overlapping at least part of the semiconductor 135 are defined in the gate insulating layer 140 and the interlayer insulating layer 160. The contact holes 162 and 164 respectively expose the contact doping regions 132 and 133 of the semiconductor 135.

A source electrode 173 and a drain electrode 175 are positioned on the interlayer insulating layer 160. Also, the source electrode 173 and the drain electrode 175 are connected to the source region 132 and the drain region 133 of the semiconductor 135 through the contact holes 162 and 164, respectively.

As described above, the semiconductor 135, the gate electrode 125, the source electrode 173, and the drain electrode 175 configure one TFT. A structure of the TFT is not limited to the aforementioned example, and may be modified to a variety of disclosed structures that can be easily implemented by those skilled in the art. The organic light emitting diode display may include a switching transistor and a driving transistor, and the aforementioned TFT may be the driving transistor. Although not illustrated, a switching TFT may be provided.

A passivation layer 180 is positioned on the TFT and the interlayer insulating layer 160. The passivation layer 180 serves to remove and flatten steps, thereby increasing luminous efficiency of the organic light emitting diode to be disposed thereon. A contact hole 182 overlapping at least a part of the drain electrode 175 is defined in the passivation layer 180.

In an exemplary embodiment, the passivation layer 180 may include at least one of a polyacrylate resin, an epoxy resin, a phenolic resin, a polyamide resin, a polyimide resin, an unsaturated polyester resin, a polyphenylene resin, a polyphenylene sulfide resin, and benzocyclobutene ("BCB"), for example.

The first electrode 191 is positioned on the passivation layer 180. In an exemplary embodiment, the first electrode 191 may include a transparent conductive material such as indium tin oxide ("ITO"), indium zinc oxide ("IZO"), zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The first electrode 191 is electrically connected to the drain electrode 175 of the TFT via the contact hole 182 defined in the passivation layer 180, and becomes the anode of the organic light emitting diode.

Although not illustrated, the first electrode 191 may include first and second transparent electrodes including a transparent conductive material, and a semi-transmissive layer positioned between the first and second transparent electrodes to form a microcavity together with the second electrode 270. That is, the first electrode 191 may be provided as a multilayer including a layer including the transparent conductive material and a layer including a reflective metal material.

The pixel definition layer 350 is positioned on the passivation layer 180 and the first electrode 191. In an exemplary embodiment, the pixel defining layer 350 may include a resin such as a polyacrylate resin and a polyimide resin, or a silica-based inorganic material, for example. The pixel definition layer 350 includes a first portion 350a and a second portion 350b, and a pixel opening 351 is defined in the pixel definition layer 350.

The first portion 350a of the pixel definition layer 350 has a predetermined thickness and encloses the pixel opening 351. The first portion 350a may be positioned between the pixel opening 351 and the second portion 350b. In FIG. 1, a boundary of the first portion 350a and the second portion 350b of the pixel definition layer 350 is indicated by a dotted line.

The second portion 350b of the pixel definition layer 350 is adjacent to the first portion 350a. A thickness t2 of the second portion 350b of the pixel definition layer 350 is less than a thickness t1 of the first portion 350a. In an exemplary embodiment, the thickness t1 of the first portion 350a of the pixel definition layer 350 may be about 1.2 micrometers (μm), and the thickness t2 of the second portion 350b of the pixel definition layer 350 may be about 0.3 μm, for example.

The pixel opening 351 of the pixel definition layer 350 means an opening region defined in the pixel definition layer 350, and may overlap a center of the first electrode 191. Accordingly, the pixel opening 351 exposes at least part of the upper surface of the first electrode 191.

An organic emission layer 370 is positioned on the first electrode 191. The organic emission layer 370 may include at least one of an emission layer, a hole-injection layer ("HIL"), a hole-transporting layer ("HTL"), an electron-transporting layer ("ETL"), and an electron-injection layer ("EIL").

The organic emission layer 370 may include a red organic emission layer 370R emitting red light, a green organic emission layer 370G emitting green light, and a blue organic emission layer 370B emitting blue light. The organic emission layer 370 may be made with an approximate diamond shape and may be disposed as a pentile type. In an exemplary embodiment, the red organic emission layer 370R and the green organic emission layer 370G may be alternately disposed in a diagonal direction, and the blue organic emission layer 370B and the green organic emission layer 370G may be alternately disposed in the diagonal direction, for example. The red organic emission layer 370R, the green organic emission layer 370G, and the blue organic emission layer 370B are positioned at different pixels from one another, thereby realizing a color image by combinations thereof.

In an alternative exemplary embodiment, the organic emission layer 370 may have a structure in which the red organic emission layer 370R, the green organic emission layer 370G, and the blue organic emission layer 370B are respectively stacked on corresponding pixels. In this case, a color image may be implemented by forming a red filter, a green filter, or a blue filter for each pixel. In another exemplary embodiment, by forming a white organic emission layer for emitting white light at each pixel and by forming a red filter, a green filter, and a blue filter for each pixel, it is possible to implement a color image. When the color image is implemented by using the white organic emission layer and the color filter, a deposition mask for respectively depositing the red organic emission layer 370R, the green organic emission layer 370G, and the blue organic emission layer 370B on each corresponding pixel, that is, on the red pixel, the green pixel, and the blue pixel, is not desired.

The white organic emission layer described in another example may be provided as a single organic emission layer, and may be provided as a plurality of organic emission layers stacked so that the white light may be emitted. In an exemplary embodiment, a structure for emitting white light by combining at least one yellow organic emission layer with at least one blue organic emission layer 370B, a structure for emitting white light by combining at least one cyan organic emission layer with at least one red organic emission layer 370R, and a structure for emitting white light by combining at least one magenta organic emission layer with at least one green organic emission layer 370G may be included, for example.

The second electrode 270 is positioned on the organic emission layer 370 and the pixel definition layer 350. In an exemplary embodiment, the second electrode 270 may include a transparent conductive material such as ITO, IZO, zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 serves as a cathode of the organic light emitting diode, for example.

The first electrode 191 includes a first portion 191a overlapping the first portion 350a of the pixel definition layer 350, a second portion 191b overlapping the second portion 350b of the pixel definition layer 350, and a third portion 191c overlapping the pixel opening 351 of the pixel definition layer 350. In this case, the overlapping means to be overlapped in the vertical direction in the cross-sectional view.

The second electrode 270 includes a first portion 270a overlapping the first portion 350a of the pixel definition layer 350, a second portion 270b overlapping the second portion 350b of the pixel definition layer 350, and a third portion 270c overlapping the pixel opening 351 of the pixel definition layer 350.

Accordingly, the first electrode 191 and the second electrode 270 overlap the first portion 350a, the second portion 350b, and the pixel opening 351 of the pixel definition layer 350.

The third portion 191c of the first electrode 191 and the third portion 270c of the second electrode 270 positioned in the pixel opening 351 are in contact with the organic emission layer 370. The third portion 191c of the first electrode 191 may in contact with the lower surface of the organic emission layer 370, and the third portion 270c of the second electrode 270 may be in contact with the upper surface of the organic emission layer 370. The third portion 191c of the first electrode 191 and the second electrode 270 form the organic light emitting diode OLED along with the organic emission layer 370. The organic light emitting diode OLED positioned in the pixel opening 351 emits the light when the TFT is in the on-state, and the pixel opening 351 defines the emission region.

The first portion 350a of the pixel definition layer 350 is positioned between the first portion 191a of the first electrode 191 and the first portion 270a of the second electrode 270. The organic emission layer 370 may be further positioned between the first portion 270a of the second electrode 270 and the first portion 350a of the pixel definition layer 350.

The second portion 350b of the pixel definition layer 350 is positioned between the second portion 191b of the first electrode 191 and the second portion 270b of the second electrode 270. The organic emission layer 370 may be further positioned between the second portion 270b of the second electrode 270 and the second portion 350b of the pixel definition layer 350. That is, the second portion 350b of the pixel definition layer 350 overlaps the organic emission layer 370.

Since the thickness t2 of the second portion 350b of the pixel definition layer 350 is less than the thickness t1 of the first portion 350a of the pixel definition layer 350, a distance between the second portion 191b of the first electrode 191 and the second portion 270b of the second electrode 270 is less than a distance between the first portion 191a of the first electrode 191 and the first portion 270a of the second electrode 270. That is, the distance between the first portion 191a of the first electrode 191 and the first portion 270a of the second electrode 270 is greater than the distance of the second portion 191b of the first electrode 191 and the second portion 270b of the second electrode 270.

In general, the thickness of the pixel definition layer 350 may be made to be substantially constant. A predetermined thickness difference may be generated between the portion of the pixel definition layer 350 overlapping the first electrode 191 and the portion of the pixel definition layer 350 that does not overlap the first electrode 191. In an exemplary embodiment, the difference in the thickness of the first electrode 191 may be generated, for example. In the illustrated exemplary embodiment, the difference between the thickness of the first portion 350a of the pixel definition layer 350 and the thickness of the second portion 350b may be larger than the thickness of the first electrode 191.

Also, the first electrode 191 does not substantially overlap the pixel definition layer 350 except for the pixel opening 351. Most of the first electrode 191 is positioned in the pixel opening 351, and only a part of the edge region of the first electrode 191 overlaps the pixel definition layer 350. In the illustrated exemplary embodiment, the first electrode 191 is positioned in the pixel opening 351 and also overlaps most of the pixel definition layer 350 except for the pixel opening 351. The first electrode 191 overlaps the first portion 350a of the pixel definition layer 350 adjacent to the pixel opening 351 and also overlaps the second portion 350b of the pixel definition layer 350.

As the second portion 350b of the pixel definition layer 350 having the smaller thickness than the thickness t1 of the first portion 350a of the pixel definition layer 350 overlaps the first electrode 191 and the second electrode 270, the current density may decrease and the driving voltage may decrease by additionally obtaining the capacitance, thereby improving reliability of the element. That is, in the illustrated exemplary embodiment, the area of the first electrode 191 positioned under the pixel definition layer 350 increases and the thickness of the pixel definition layer 350 positioned between the first electrode 191 and the second electrode 270 decreases, thereby additionally obtaining the capacitance.

It is preferable that the thickness t1 of the first portion 350a of the pixel definition layer 350 is more than a predetermined thickness. When the thickness of the first portion 350a decreases to the thickness level of the second portion 350b, the capacitance may further increase, but boundaries between the plurality of pixels become unclear. In an exemplary embodiment, when the first portion 350a is less than the predetermined thickness, the green organic emission layer 370G or the blue organic emission layer 370B may penetrate in the pixel opening 351 in which the red organic emission layer 370R is disposed, for example. Accordingly, as the thickness t1 of the first portion 350a positioned between the pixel opening 351 and the second portion 350b is greater than the thickness t2 of the second portion 350b, color mixture between the adjacent pixels may be prevented.

The distance between the third portion 191c of the first electrode 191 and the third portion 270c of the second electrode 270 is smaller than the distance between the first portion 191a of the first electrode 191 and the first portion 270a of the second electrode 270. Also, the distance between the third portion 191c of the first electrode 191 and the third portion 270c of the second electrode 270 is smaller than the distance between the second portion 191b of the first electrode 191 and the second portion 270b of the second electrode 270.

The first portion 191a of the first electrode 191 and the first portion 270a of the second electrode 270 overlapping the first portion 350a of the pixel definition layer 350 are not in contact with the organic emission layer 370. The second portion 191b of the first electrode 191 and the second portion 270b of the second electrode 270 overlapping the second portion 350b of the pixel definition layer 350 are not in contact with the organic emission layer 370. Accordingly, the portion overlapping the first portion 350a and the second portion 350b of the pixel definition layer 350 does not emit the light.

Next, the manufacturing method of the display device according to the illustrated exemplary embodiment will be described with reference to FIGS. 3 and 4.

Particularly, the method of forming the pixel definition layer of the display device according to the illustrated exemplary embodiment will be described.

Figure 3:
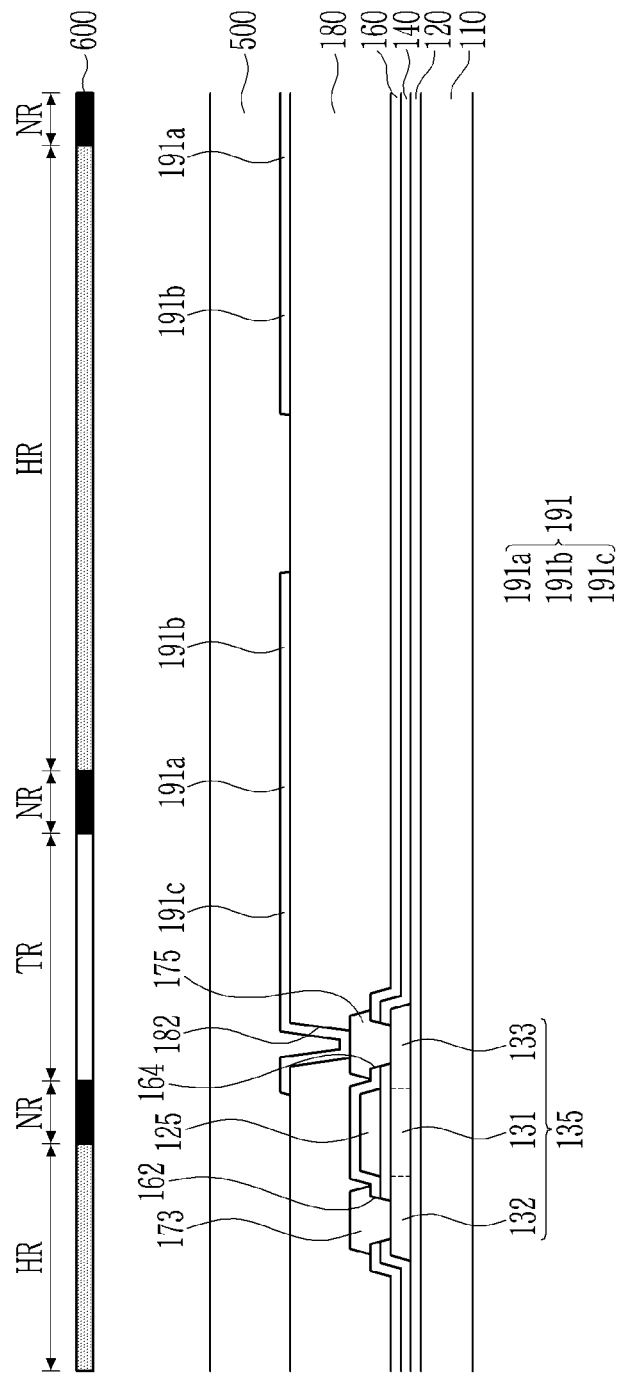
FIGS. 3 and 4 are process cross-sectional views showing an exemplary embodiment of a manufacturing method of a display device.
Figure 4:
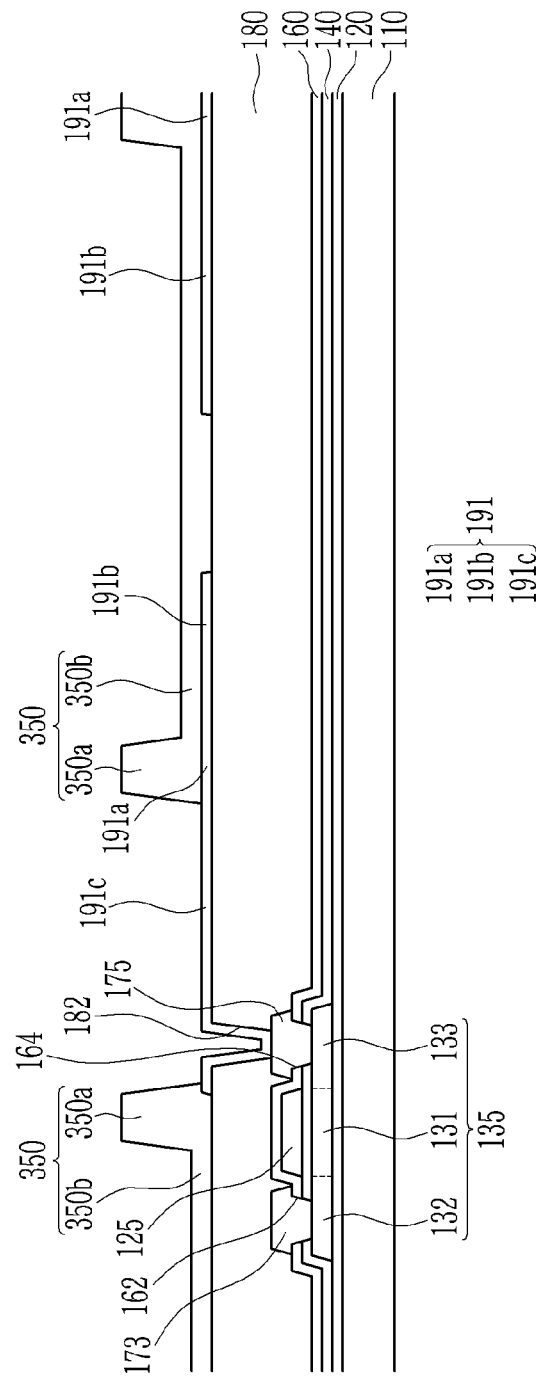

FIGS. 3 and 4 are process cross-sectional views showing a manufacturing method of a display device according to an exemplary embodiment.

As shown in FIG. 3, a semiconductor 135, a gate electrode 125, a source electrode 173, and a drain electrode 175 are sequentially disposed on a substrate 110 to form a TFT. A passivation layer 180 is disposed on the TFT, and the passivation layer 180 is patterned to define a contact hole 182 exposing at least part of the drain electrode 175. A first electrode 191 connected with the drain electrode 175 is disposed on the passivation layer 180.

An organic material layer 500 is disposed on the passivation layer 180 and the first electrode 191. A mask 600 is aligned on the organic material layer 500 and an exposure process is performed. In this case, the mask 600 may be a slit mask or a half-tone mask. The mask 600 includes a non-transmissive region NR blocking most of light, a half-transmissive region HR blocking some of light and allowing the remaining light to be transmitted therethrough, and a transmissive region TR allowing most of light to be transmitted therethrough. When the mask 600 is a slit mask, the half-transmissive region HR may be provided to have a slit shape.

A portion of the organic material layer 500 corresponding to the non-transmissive region NR of the mask 600 is not substantially exposed to light, a portion of the organic material layer 500 corresponding to the half-transmissive region HR of the mask 600 is exposed to some of light, and a portion of the organic material layer 500 corresponding to the transmissive region TR of the mask 600 is exposed to most of light.

As shown in FIG. 4, the organic material layer 500 is patterned to form a pixel definition layer 350 including a first portion 350*a* and a second portion 350*b* having different thicknesses. The first electrode 191 is exposed by the portion where the organic material layer 500 is removed and the portion defines the pixel opening 351 of the pixel definition layer 350.

Next, an organic emission layer 370 and a second electrode 270 are sequentially disposed on the first electrode 191 to complete the display device according to the exemplary embodiment shown in FIG. 2.

Next, the display device according to an exemplary embodiment will be described with reference to FIGS. 5 and 6.

Figure 5:
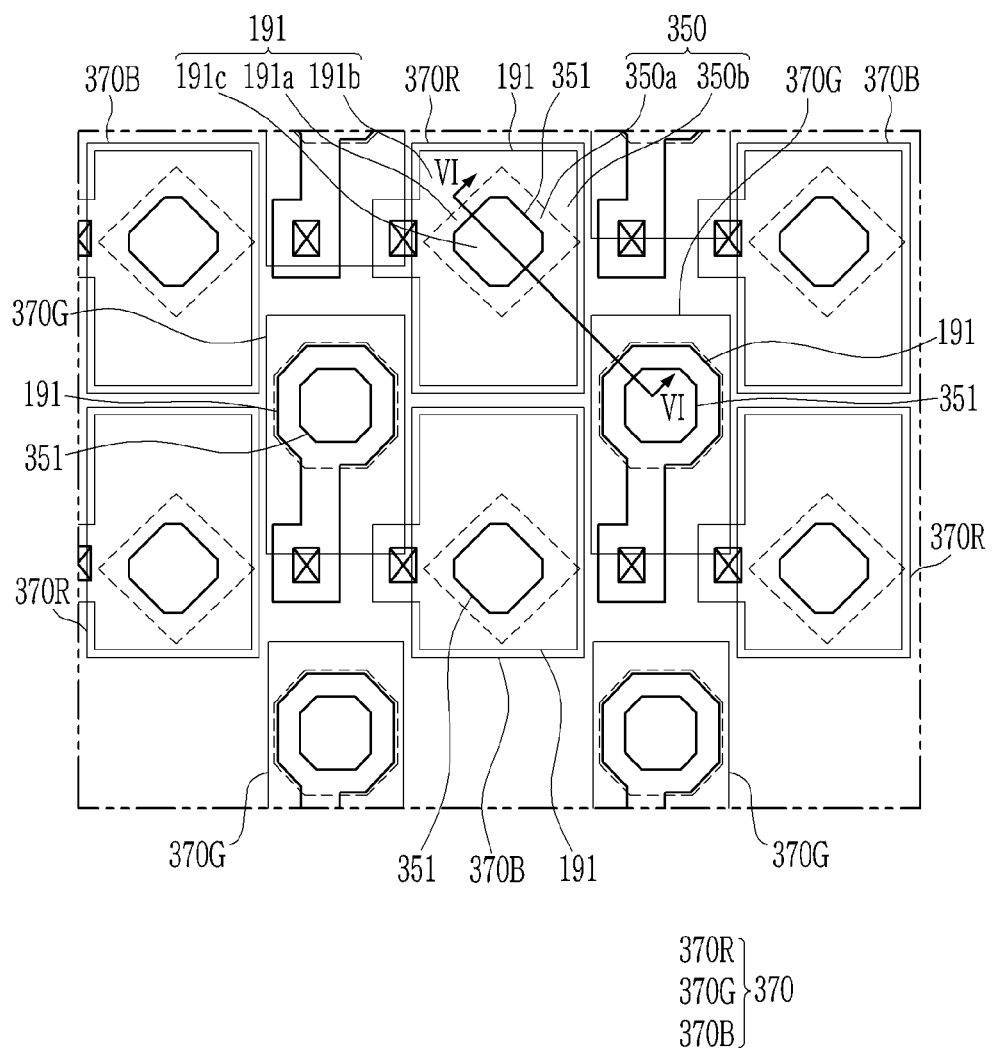
FIG. 5 is a plan view of an exemplary embodiment of a display device.
Figure 6:
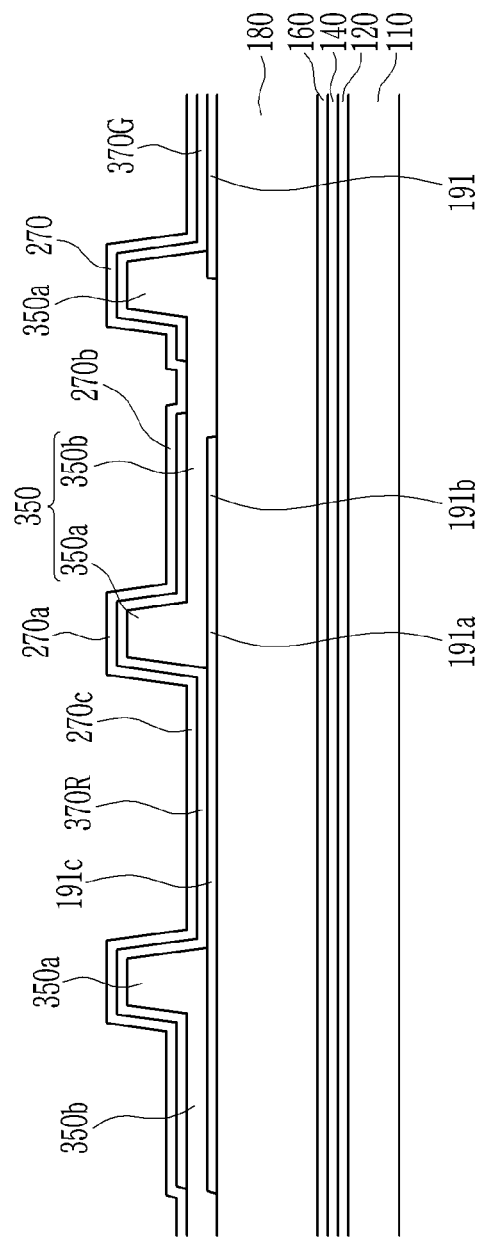
FIG. 6 is a cross-sectional view of the display device of FIG. 5 taken along line VI-VI.

The display device according to the exemplary embodiment shown in FIGS. 5 and 6 is substantially the same as the display device according to an exemplary embodiment shown in FIGS. 1 and 2 such that the description thereof is omitted. In the illustrated exemplary embodiment, a plane shape of the first electrode and the organic emission layer in a plan view is different from the previous exemplary embodiment, and this is described in detail.

FIG. 5 is a plan view of a display device according to an exemplary embodiment, and FIG. 6 is a cross-sectional view of the display device of FIG. 5 taken along line VI-VI.

Like the previous exemplary embodiment, the display device according to an exemplary embodiment includes a first electrode 191, a second electrode 270 positioned on the first electrode 191, and a pixel definition layer 350 positioned between the first electrode 191 and the second electrode 270.

In the previous exemplary embodiment, the first electrode 191 is made as a polygon having ten or more sides in a plan view, but the first electrode 191 may have a shape similar to a rectangle in the illustrated exemplary embodiment. That is, in the illustrated exemplary embodiment, the shape of the first electrode 191 is simpler than the shape of the first electrode 191 in the previous exemplary embodiment, and a size thereof is further increased.

In the previous exemplary embodiment, the organic emission layer 370 is provided with the diamond shape in a plan view, but the organic emission layer 370 is provided as a rectangle in a plan view in the illustrated exemplary embodiment.

The shape of the first electrode 191 and the organic emission layer 370 is not limited thereto and may be variously changed. In an exemplary embodiment, the first electrode 191 and the organic emission layer 370 may be provided as the polygon having a plurality of sides, and some sides may be replaced with a curved line, for example.

In the display device according to an exemplary embodiment, the pixels are disposed as the pentile type in which capacitance of the red pixel and the blue pixel is desired, but additional capacitance may not be desired in the green pixel. Accordingly, the area expansion of the first electrode 191 is desired in the red pixel and the blue pixel, and the first electrode 191 may overlap the pixel definition layer 350 except for the pixel opening 351 like a general structure in the green pixel. Also, a thickness reduction of the partial region of the pixel definition layer may be desired in the red pixel and the blue pixel, and the thickness of the pixel definition layer may be provided to be constant in the green pixel.

Next, the display device according to an exemplary embodiment will be described with reference to FIGS. 7 and 8.

Figure 7:
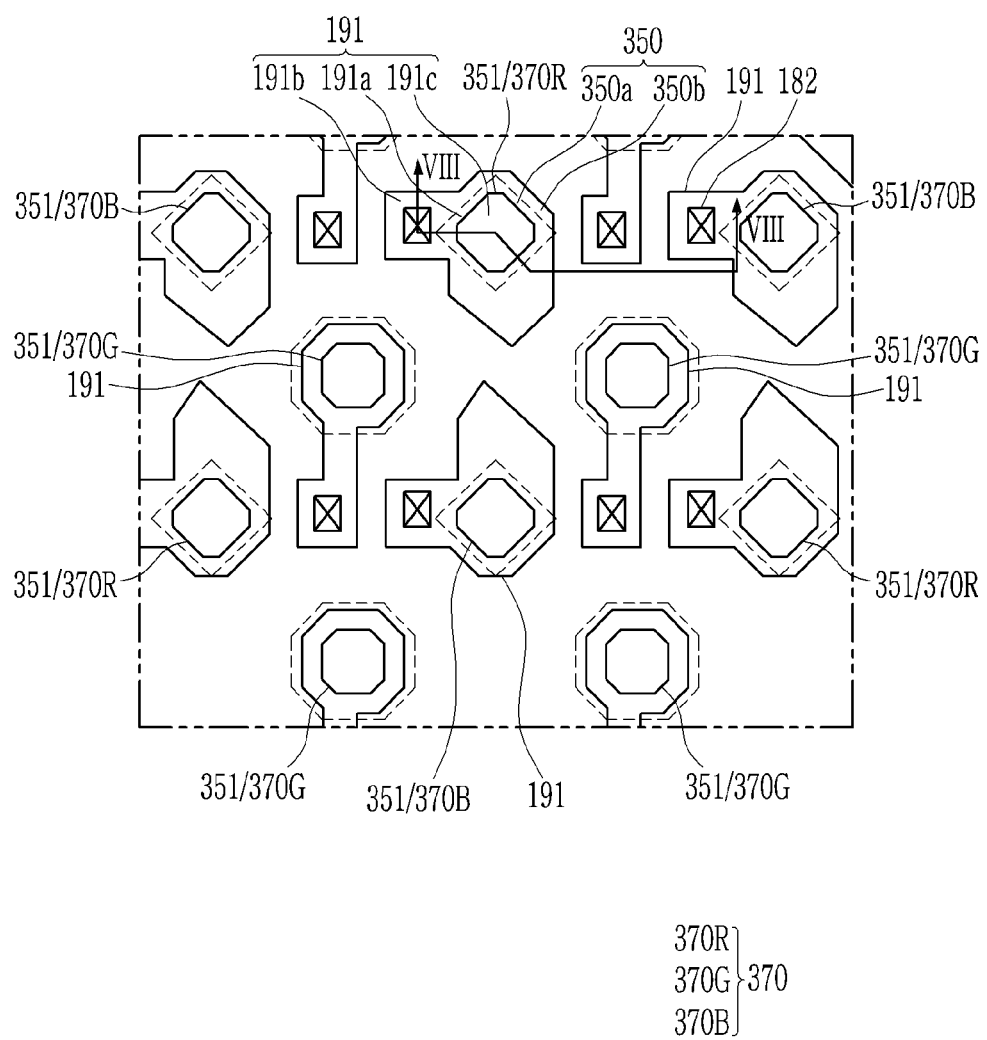
FIG. 7 is a plan view of an exemplary embodiment of a display device.
Figure 8:
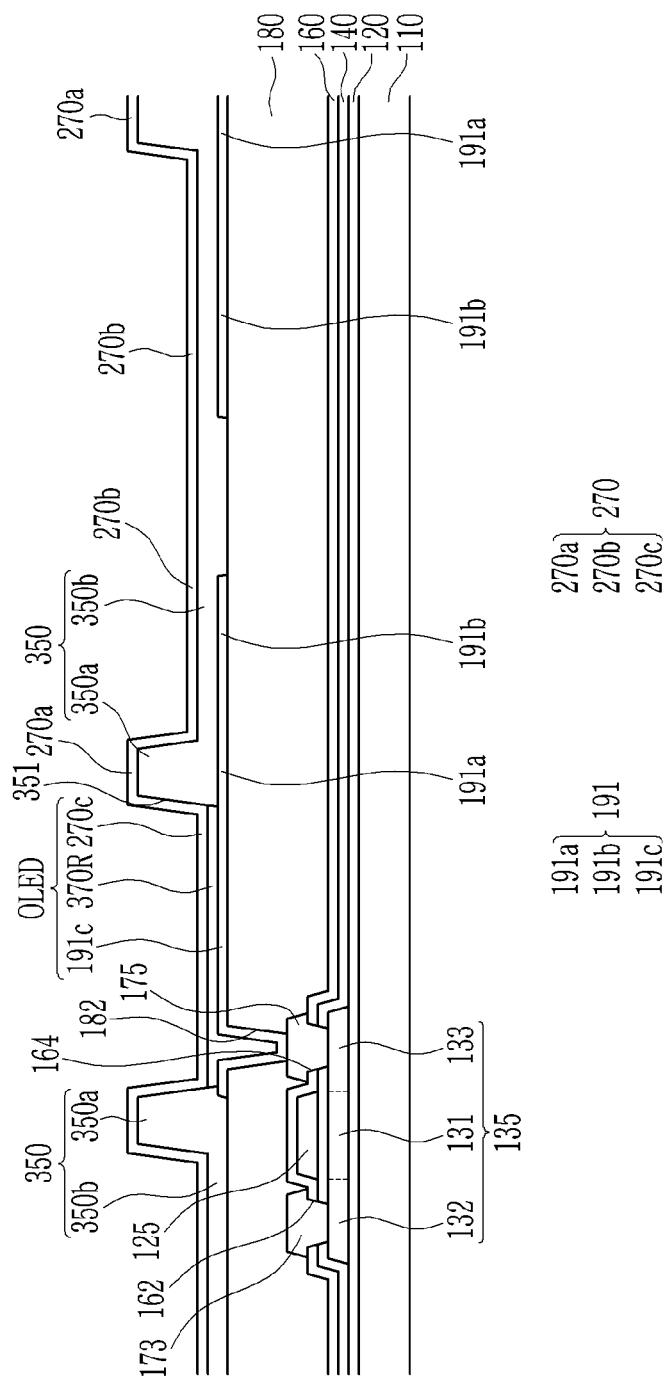
FIG. 8 is a cross-sectional view of the display device of FIG. 7 taken along line VIII-VIII.

The display device according to the exemplary embodiment shown in FIGS. 7 and 8 is substantially the same as the display device according to an exemplary embodiment shown in FIGS. 1 and 2 such that the description thereof is omitted. In the illustrated exemplary embodiment, a point that the organic emission layer does not overlap the first portion and the second portion of the pixel definition layer is different from the previous exemplary embodiment, and this is described in detail.

FIG. 7 is a plan view of a display device according to an exemplary embodiment, and FIG. 8 is a cross-sectional view of the display device of FIG. 7 taken along line VIII-VIII.

As shown in FIGS. 7 and 8, the display device according to an exemplary embodiment includes the substrate 110, the first electrode 191 positioned on the substrate 110, and the second electrode 270 positioned on the first electrode 191. The pixel definition layer 350 is positioned between the first electrode 191 and the second electrode 270.

In the previous exemplary embodiment, the organic emission layer 370 overlaps the first portion 350*a*, the second portion 350*b*, and the pixel opening 351 of the pixel definition layer 350, but the organic emission layer 370 overlaps the pixel opening 351 of the pixel definition layer 350 in the illustrated exemplary embodiment. In the illustrated exemplary embodiment, the organic emission layer 370 does not overlap the first portion 350*a* and the second portion 350*b* of the pixel definition layer 350. That is, the organic emission layer 370 is only positioned in the pixel opening 351 of the pixel definition layer 350.

Even when the organic emission layer 370 does not overlap the second portion 350*b* of the pixel definition layer 350, the capacitance is generated between the second portion 191*b* of the first electrode 191 and the second portion 270*b* of the second electrode 270. Accordingly, in the illustrated exemplary embodiment, as the first electrode 191 and the second electrode 270 overlap via the second portion 350*b* of the organic emission layer 370, the capacitance may be additionally secured, thereby improving the reliability of the element.

Next, the display device according to an exemplary embodiment will be described with reference to FIGS. 9 and 10.

Figure 9:
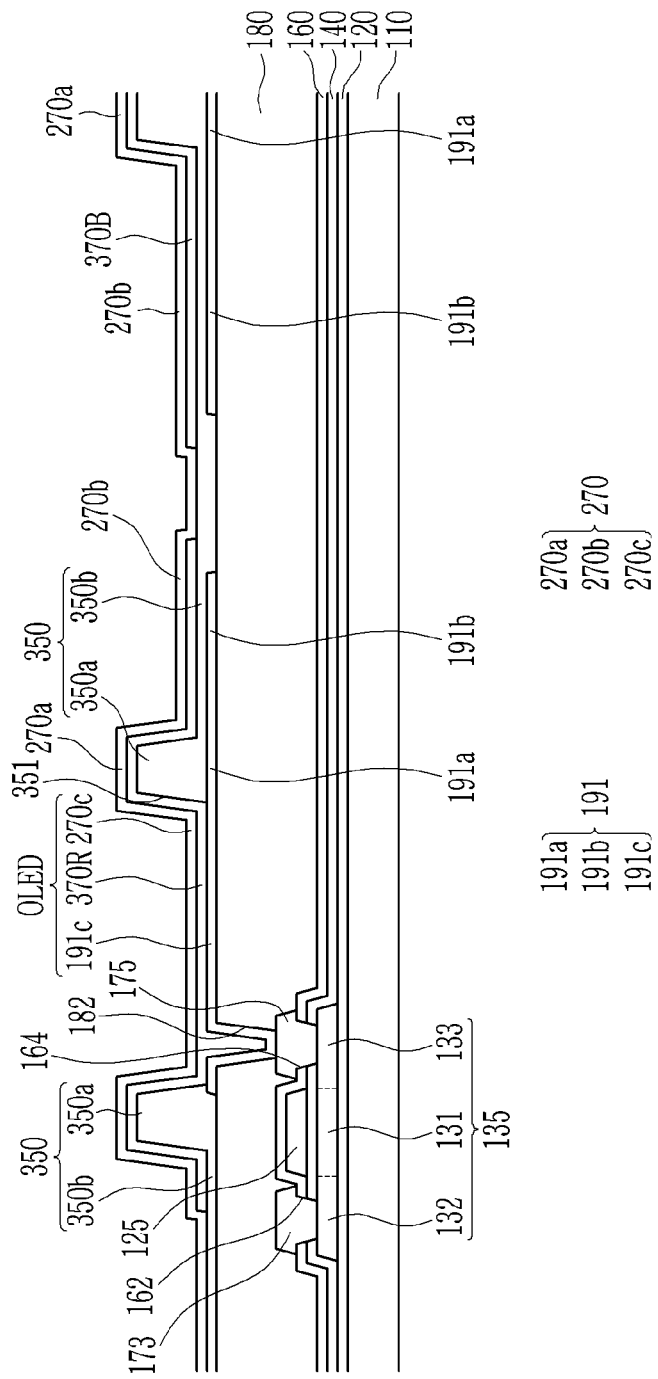
FIGS. 9 and 10 are cross-sectional views of an exemplary embodiment of a display device.
Figure 10:
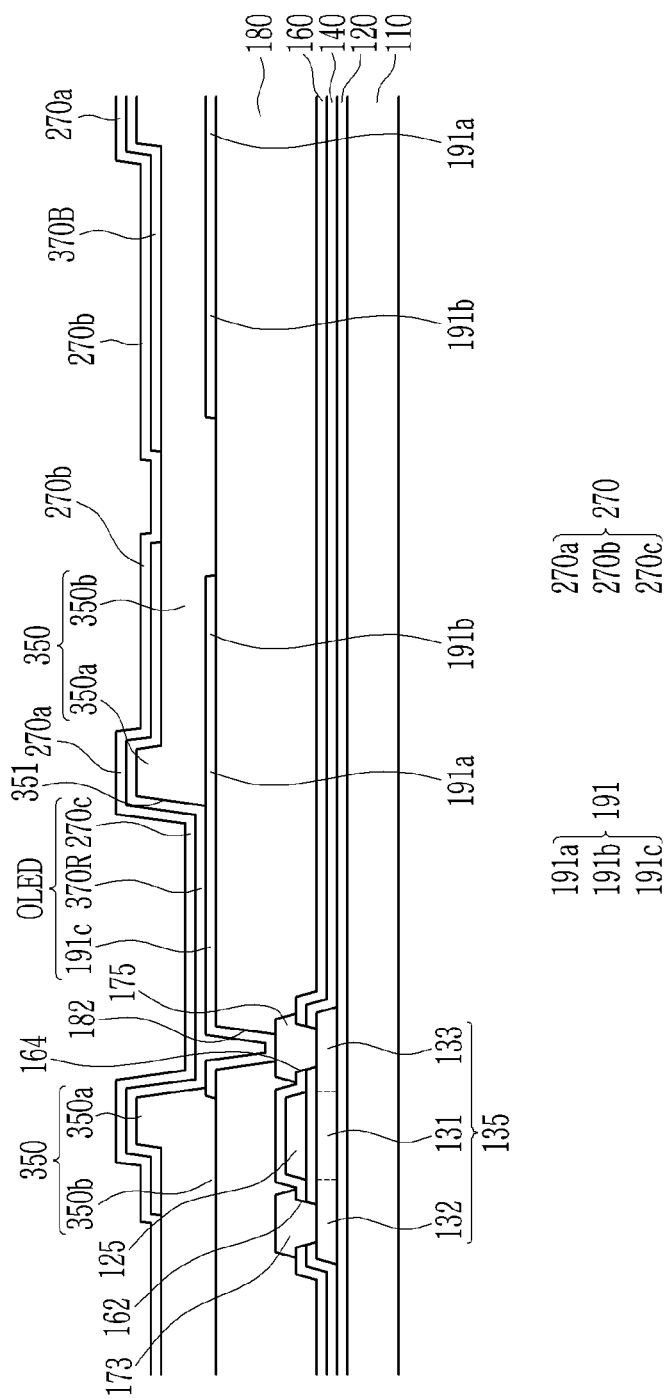

The display device according to the exemplary embodiment shown in FIGS. 9 and 10 is substantially the same as the display device according to an exemplary embodiment shown in FIGS. 1 and 2 such that the description thereof is omitted. In the illustrated exemplary embodiment, a point that the thickness of the pixel definition layer is changed is different from the previous exemplary embodiment, and this is described in detail.

FIGS. 9 and 10 are cross-sectional views of a display device according to an exemplary embodiment.

As shown in FIG. 9, the second portion 350b of the pixel definition layer 350 of the display device according to the illustrated exemplary embodiment may be less than the second portion 350b of the pixel definition layer 350 of the display device according to the exemplary embodiment shown in FIGS. 1 and 2.

As shown in FIG. 10, the second portion 350b of the pixel definition layer 350 of the display device according to the illustrated exemplary embodiment may be greater than the second portion 350b of the pixel definition layer 350 of the display device according to the exemplary embodiment shown in FIGS. 1 and 2.

In this way, the thickness of the second portion 350b of the pixel definition layer 350 may be changed within a predetermined range. When the second portion 350b of the pixel definition layer 350 is very thin, the first electrode 191 and the organic emission layer 370 may be in contact or the first electrode 191 and the second electrode 270 may be shorted. Accordingly, it is preferable that the second portion 350b of the pixel definition layer 350 includes the predetermined thickness or more. When the second portion 350b of the pixel definition layer 350 is very thick, the capacitance may be hardly provided between the first electrode 191 and the second electrode 270. Accordingly, it is preferable that the second portion 350b of the pixel definition layer 350 includes the predetermined thickness or less.

As the second portion 350b of the pixel definition layer 350 becomes thinner, the capacitance can be further secured. Also, as the area of the second portion 191b of the first electrode 191 overlapping the second portion 350b of the pixel definition layer 350 is expanded, the capacitance can be further secured.

Next, the display device according to an exemplary embodiment will be described with reference to FIGS. 11 and 12.

Figure 11:
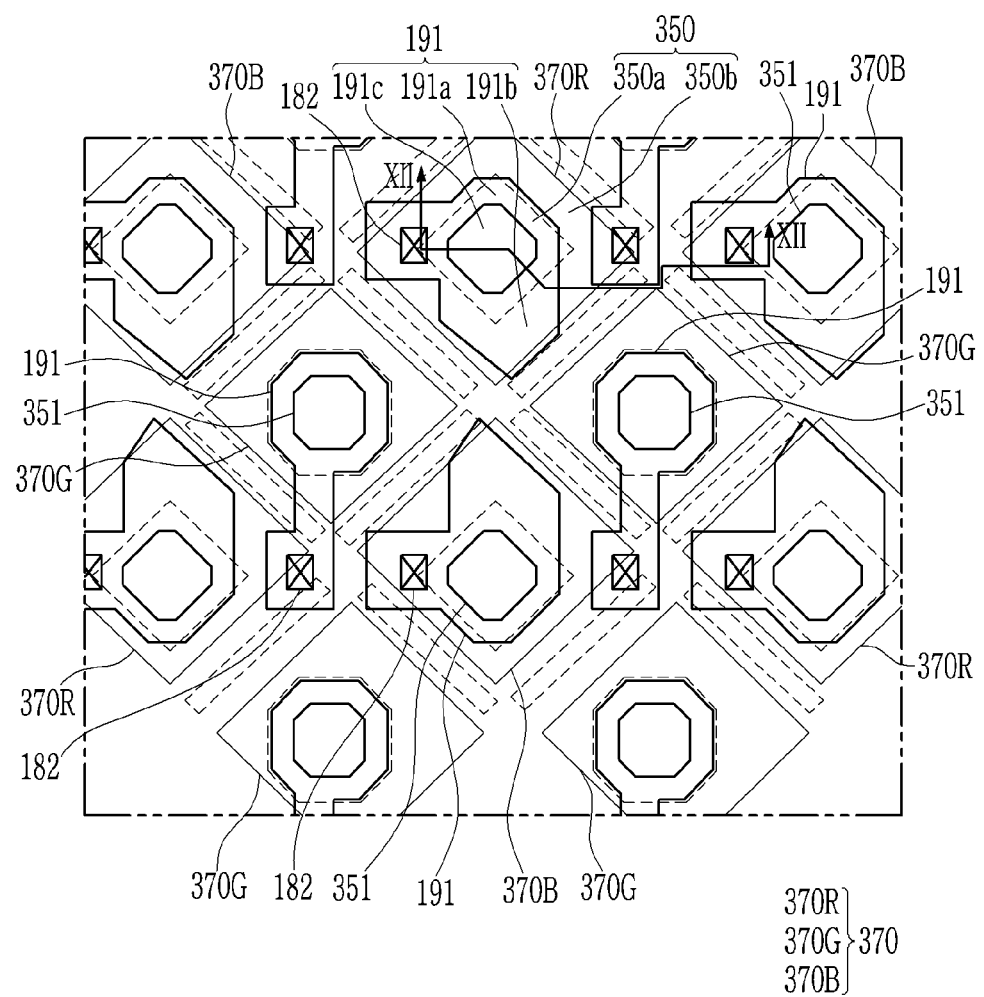
FIG. 11 is a plan view of an exemplary embodiment of a display device.
Figure 12:
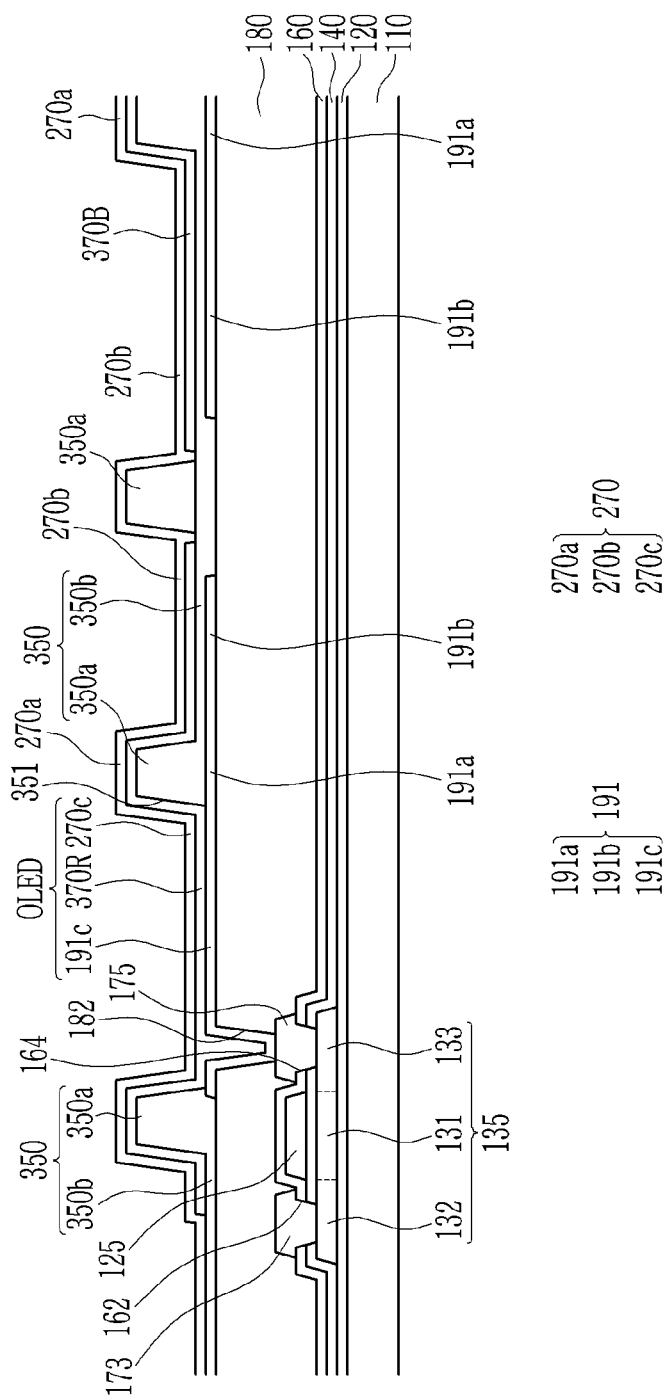
FIG. 12 is a cross-sectional view of the display device of FIG. 11 taken along line XII-XII.

The display device according to the exemplary embodiment shown in FIGS. 11 and 12 is substantially the same as the display device according to an exemplary embodiment shown in FIGS. 1 and 2 such that the description thereof is omitted. In the illustrated exemplary embodiment, a point that the first portion 350a of the pixel definition layer 350 is further positioned between the plurality of second portions 350b adjacent to each other is different from the previous exemplary embodiment, and this is described in detail.

FIG. 11 is a plan view of a display device according to an exemplary embodiment, and FIG. 12 is a cross-sectional view of the display device of FIG. 11 taken along line XII-XII.

The first portion 350a of the pixel definition layer 350 is positioned between the pixel opening 351 and the second portion 350b in the previous exemplary embodiment, but the first portion 350a of the pixel definition layer 350 is positioned between the pixel opening 351 and the second portion 350b and between the plurality of second portions 350b adjacent to each other in the illustrated exemplary embodiment.

The organic emission layer 370 may overlap the second portion 350b of the pixel definition layer 350. Although the organic emission layers 370 adjacent to each other are designed to be overlapped with each other, the organic emission layers 370 adjacent to each other may be overlapped with each other in the process. In an exemplary embodiment, the red organic emission layer 370R and the blue organic emission layer 370B may be overlapped with each other, and when the overlapping part is positioned in the pixel opening 351, the color mixing phenomenon may be generated, for example. In the illustrated exemplary embodiment, as the first portion 350a is further disposed between the plurality of second portions 350b adjacent to each other, the adjacent organic emission layers 370 may be provided not to be overlapped with each other, thereby preventing the color mixing phenomenon.

Next, the display device according to an exemplary embodiment will be described with reference to FIGS. 13 to 17.

The display device according to the exemplary embodiment shown in FIGS. 13 to 17 is substantially the same as the display device according to an exemplary embodiment shown in FIGS. 1 and 2 such that the description thereof is omitted. In the illustrated exemplary embodiment, a point that seven transistors are included in one pixel is different from the previous exemplary embodiment, and this is described in detail. However, a number of transistor sand capacitors included in one pixel may be variously changed, and an arrangement shape of the transistor sand the capacitors may be variously changed.

Figure 13:
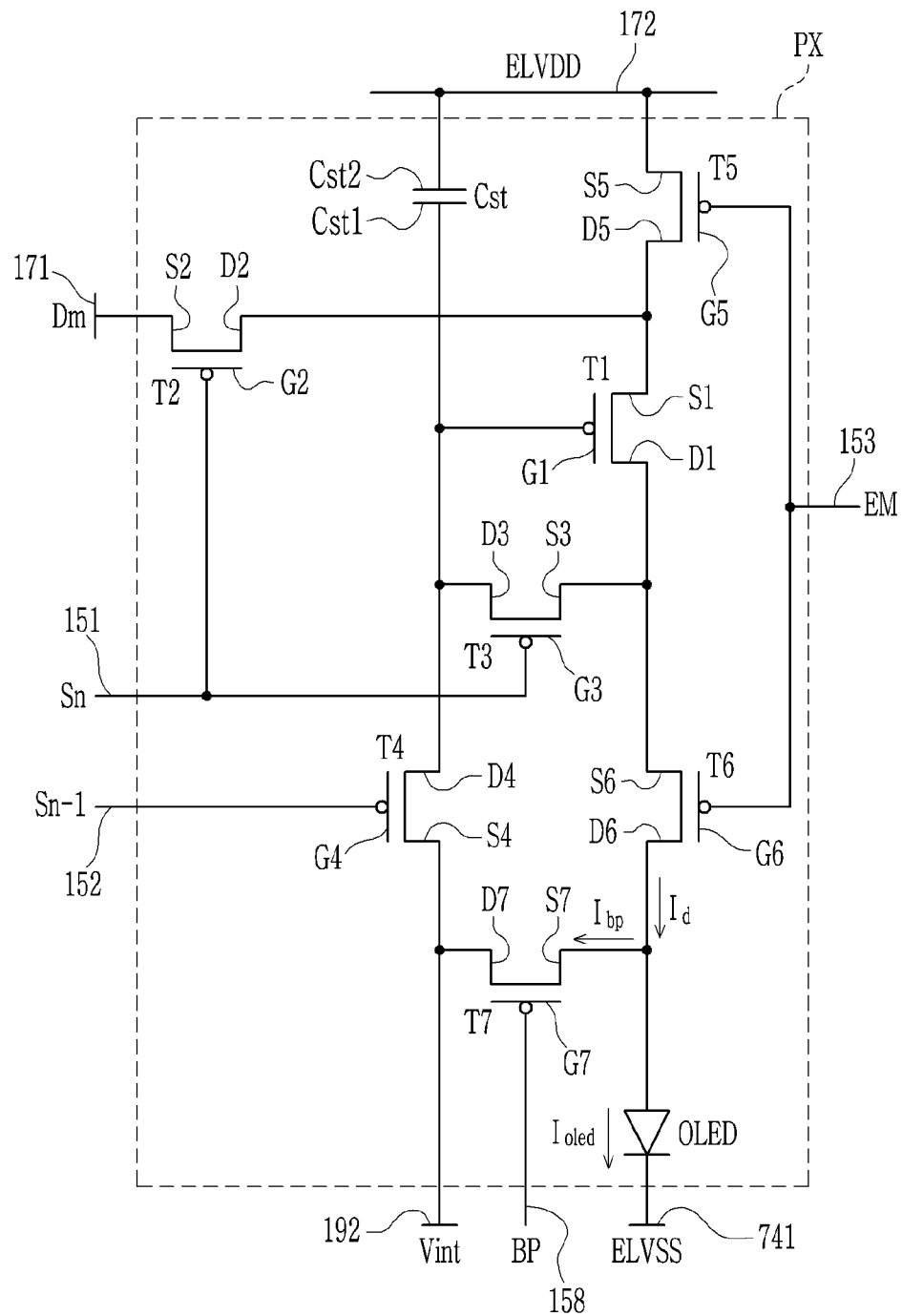
FIG. 13 is an equivalent circuit diagram of an exemplary embodiment of one pixel of a display device.
Figure 14:
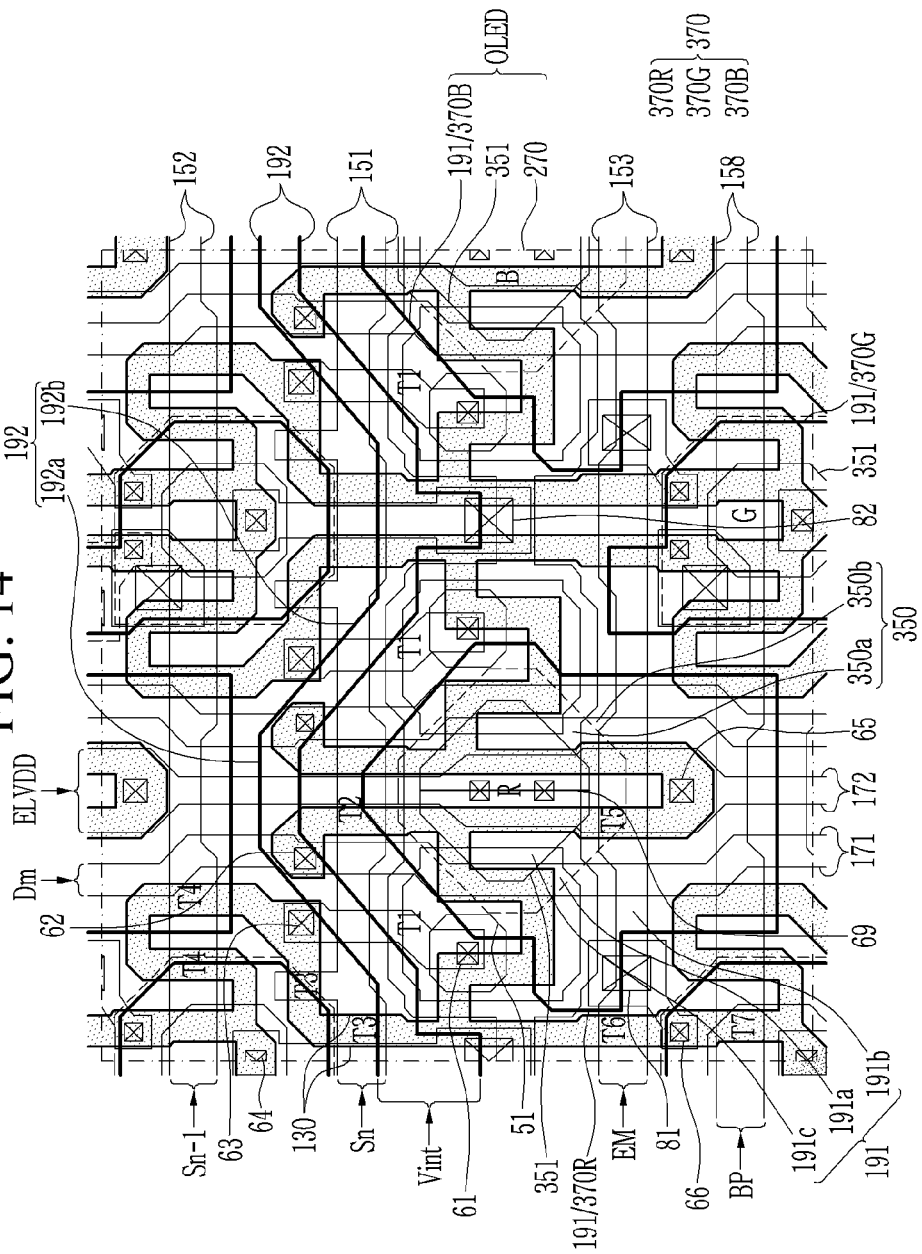
FIG. 14 is a schematic plan view of an exemplary embodiment of a transistor and a capacitor of a red pixel, a green pixel, and a blue pixel of a display device.
Figure 15:
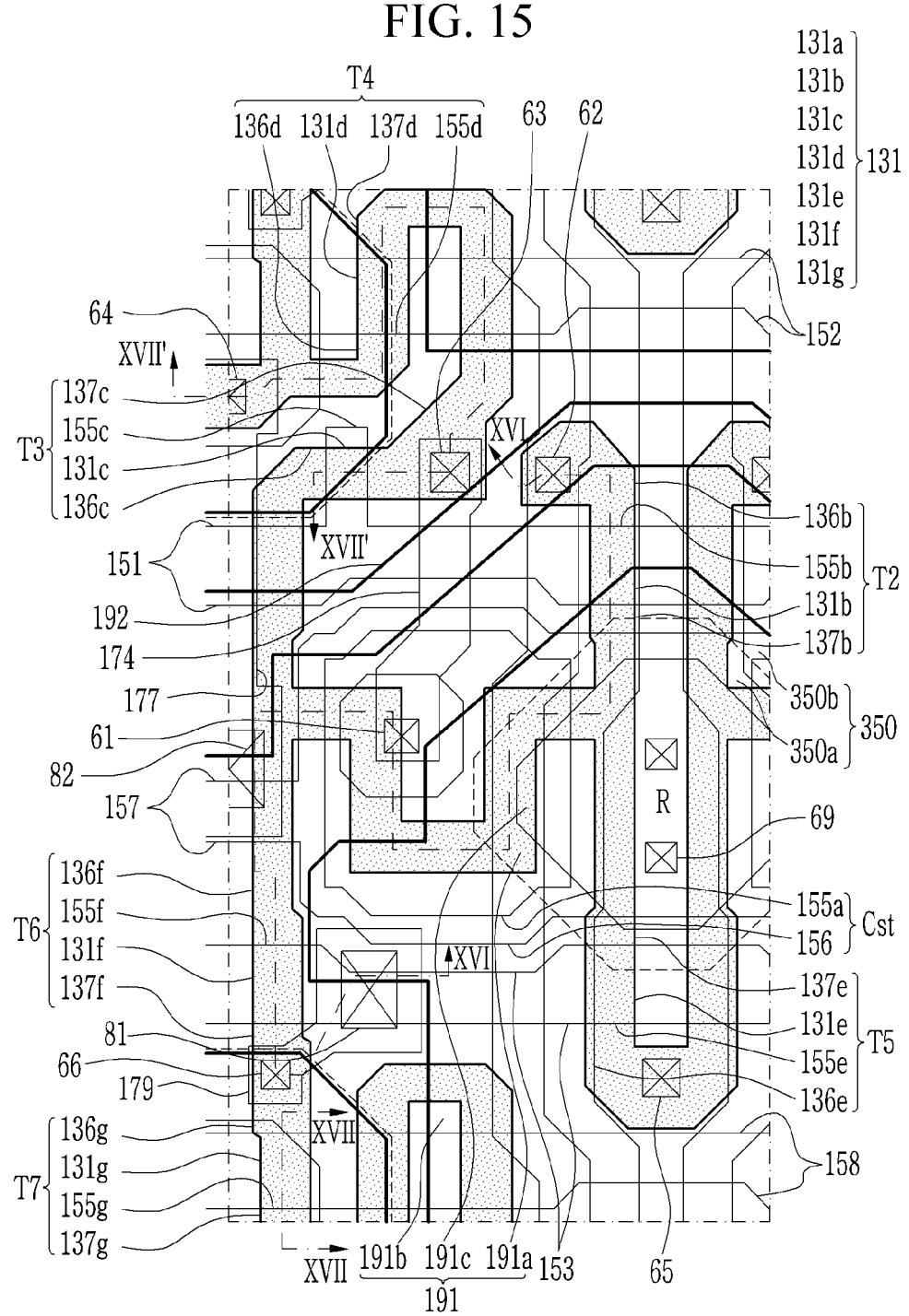
FIG. 15 is a detailed plan view of one pixel of FIG. 14.
Figure 16:
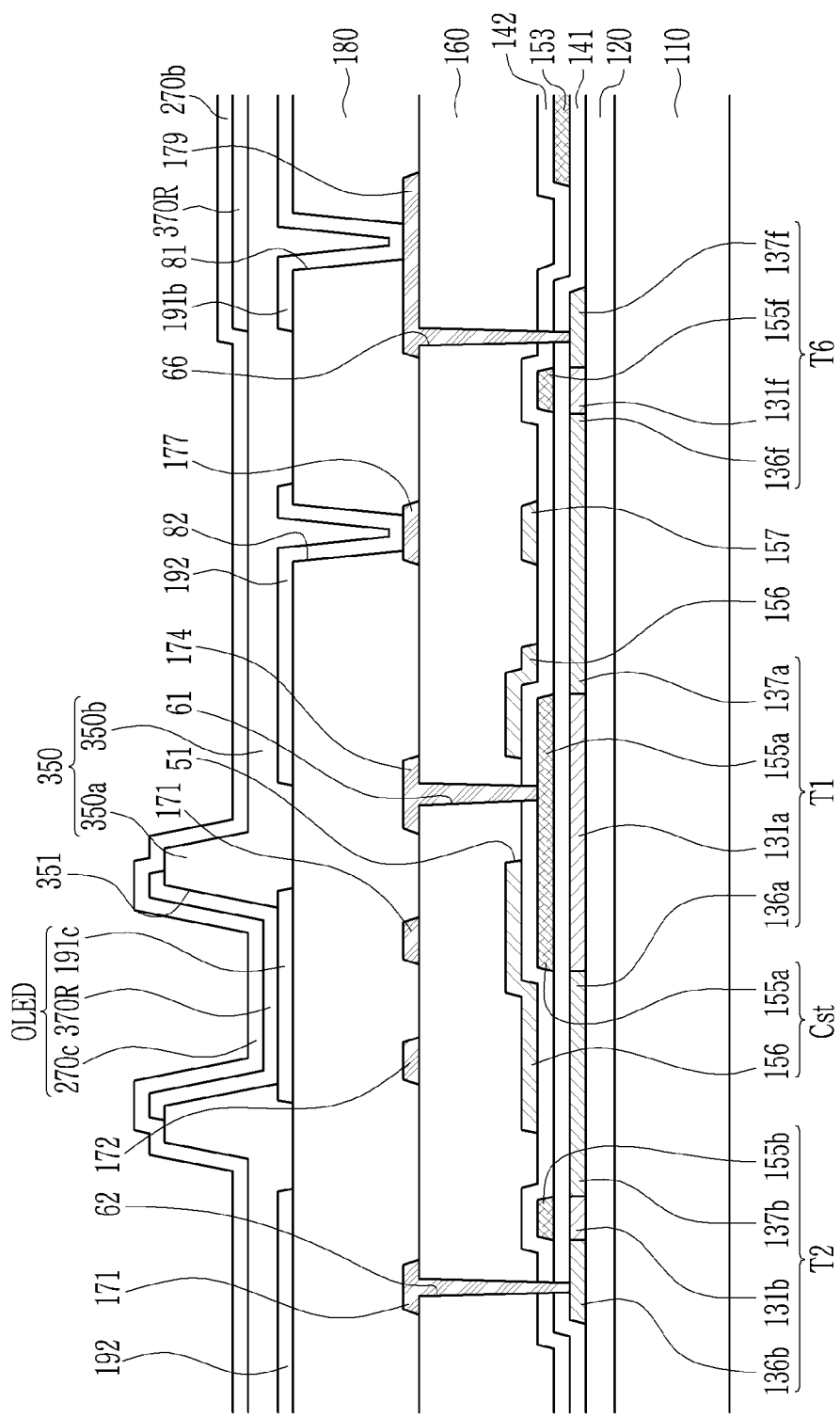
FIG. 16 is a cross-sectional view of the display device of FIG. 15 taken along line XVI-XVI.
Figure 17:
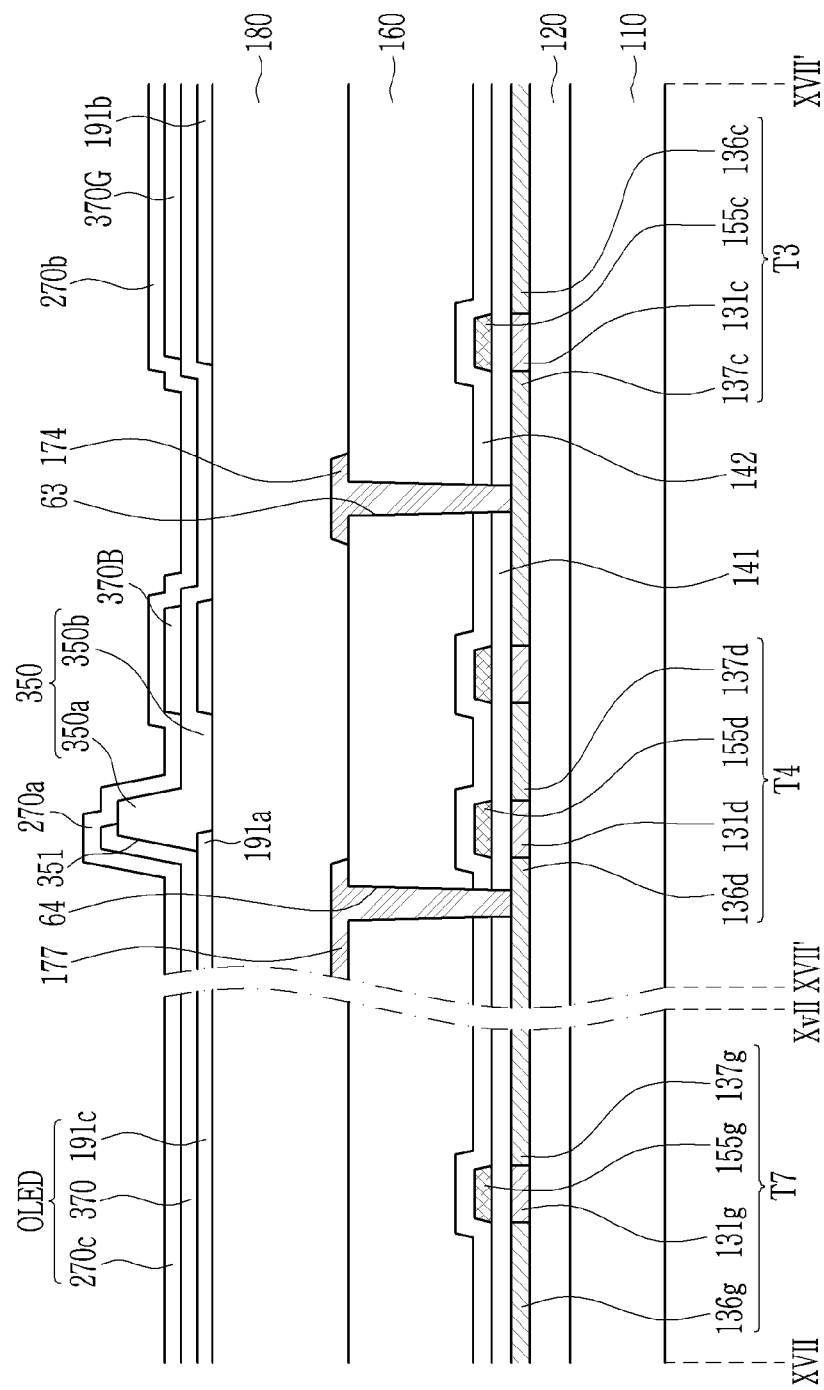
FIG. 17 a cross-sectional view of the display device of FIG. 15 taken along lines XVII-XVII and XVII'-XVII'.

FIG. 13 is an equivalent circuit diagram of one pixel of a display device according to an exemplary embodiment, FIG. 14 is a schematic plan view of a transistor and a capacitor of a red pixel, a green pixel, and a blue pixel of a display device according to an exemplary embodiment, and FIG. 15 is a detailed plan view of one pixel of FIG. 14. FIG. 16 is a cross-sectional view of the display device of FIG. 15 taken along line XVI-XVI, and FIG. 17 is a cross-sectional view of the display device of FIG. 15 taken along lines XVII-XVII and XVII'-XVII'.

As shown in FIG. 13, the organic light emitting diode display according to an exemplary embodiment includes a plurality of signal lines 151, 152, 153, 158, 171, 172, and 192, and a plurality of pixels PX connected to the plurality of signal lines and arranged as a substantially matrix type.

Each pixel PX includes a plurality of transistors T1, T2, T3, T4, T5, T6, and T7 respectively connected to the plurality of signal lines 151, 152, 153, 158, 171, 172, and 192, a storage capacitor Cst, and an organic light emitting diode OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transferring a scan signal Sn, a previous scan line 152 transferring a previous scan signal S(n−1) to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and provided to be substantially parallel with the data line 171, and an initialization voltage line 192 transferring an initialization voltage Vint initializing the driving transistor T1.

A gate electrode G1 of the driving transistor T1 is connected to one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLED via the emission control transistor T6. The driving transistor T1 receives the data signal Dm according to a switching operation of the switching transistor T2 to supply a driving current $I_d$ to the organic light emitting diode OLED. An OLED current $I_{oled}$ flowing into the organic light emitting diode OLED may be derived by subtracting a bypass current $I_{bp}$ flowing into the source electrode S7 of the bypass transistor T7 from the driving current $I_d$.

A gate electrode G2 of the switching transistor T2 is connected with the scan line 121, a source electrode S2 of the switching transistor T2 is connected with the data line 171, and a drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 121 to perform a switching operation transferring the data signal Dm transferred to the data line 171 to the source electrode S1 of the driving transistor T1.

A gate electrode G3 of the compensation transistor T3 is directly connected with the scan line 121, a source electrode S3 of the compensation transistor T3 is connected to the drain electrode D1 of the driving transistor T1 and connected with an anode of the organic light emitting diode OLED via the emission control transistor T6, and a drain electrode D3 of the compensation transistor T3 is connected with one end Cst1 of the storage capacitor Cst and the drain electrode D4 of the initialization transistor T4 together with the gate electrode G1 of the driving transistor T1. The compensation transistor T3 is turned on according to the scan signal Sn received through the scan line 121 to connect the gate electrode G1 and the drain electrode D1 of the driving transistor T1, thereby diode-connecting the driving transistor T1.

A gate electrode G4 of the initialization transistor T4 is connected with a previous scan line 152, a source electrode S4 of the initialization transistor T4 is connected with the initialization voltage line 192, and a drain electrode D4 of the initialization transistor T4 is connected with one end Cst1 of the storage capacitor Cst, the drain electrode D3 of the compensation transistor T3, and the gate electrode G1 of the driving transistor T1. The initialization transistor T4 is turned on according to the previous scan signal S(n−1) received through the previous scan line 152 to transfer the initialization voltage Vint to the gate electrode G1 of the driving transistor T1, and then perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode D2 of the switching transistor T2.

A gate electrode G6 of the emission control transistor T6 is connected with the light emission control line 153, a source electrode S6 of the emission control transistor T6 is connected with the drain electrode D1 of the driving transistor T1 and the source electrode S3 of the compensation transistor T3, and a drain electrode D6 of the emission control transistor T6 is electrically connected with an anode of the organic light emitting diode OLED. The operation control transistor T5 and the first emission control transistor T6 are simultaneously turned on according to the emission control signal EM transmitted to the light emission control line 153 such that the driving voltage ELVDD is compensated through the diode-connected driving transistor T1 and is transmitted to the organic light emitting diode OLED.

A gate electrode G7 of the thin film bypass transistor T7 is connected to the bypass control line 158, a source electrode S7 of the bypass transistor T7 is connected to the drain electrode D6 of the light emission control transistor T6 and the anode of the organic light emitting diode OLED together, and a drain electrode D7 of the bypass transistor T7 is connected to the initialization voltage line 192 and the source electrode S4 of the initialization transistor T4. In this case, the previous scan line 152 is connected to the scan line 151 transmitting the scan signal Sn in the previous pixel (not shown), and the bypass control line 158 corresponds to the previous scan line 152 such that the bypass signal BP is the same as the previous scan signal S(n−1).

The other end Cst2 of the storage capacitor Cst is connected with the driving voltage line 172, and a cathode of the organic light emitting diode OLED is connected with a common voltage line 741 transferring a common voltage ELVSS.

As shown in FIGS. 14 and 15, the display device according to an exemplary embodiment includes a gate metal line 151, 152, 153, and 158 including a scan line 151, a previous scan line 152, a light emission control line 153, and a bypass control line 158 respectively applying a scan signal Sn, a previous scan signal S(n−1), a light emission control signal EM, and a bypass signal BP, and provided in the row direction. In the exemplary embodiment, the bypass control line 158 is substantially the same as the previous scan line 152.

Also, a data metal line 171 and 172 includes a data line 171 and a driving voltage line 172 crossing the scan line 151, the previous scan line 152, the light emission control line 153, and the bypass control line 158 and respectively applying a data signal Dm and a driving voltage ELVDD to the pixel PX. The initialization voltage Vint is transmitted from the initialization voltage line 192 to the compensation transistor T3 through the initialization transistor T4. The initialization voltage line 192 is provided while alternately having a straight portion 192a and an oblique portion 192b. The straight portion 192a is disposed to be parallel to the scan line 121, and the oblique portion 192b extends at a predetermined angle with the straight portion 192a.

Also, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED. The pixel PX shown in FIGS. 13 and 14 may correspond to the red pixel R, the green pixel G, and the blue pixel B forming the pentile matrix structure.

The organic light emitting diode OLED includes the first electrode 191, the organic emission layer 370, and the second electrode 270. In this case, the compensation transistor T3 and the initialization transistor T4 may be provided as a transistor having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is provided inside one connected semiconductor 130 which may be bent in various shapes. In an exemplary embodiment, the semiconductor 130 may include polysilicon or an oxide semiconductor, for example.

The semiconductor 130 includes a channel which is doped with an N-type impurity or a P-type impurity, and a source doping part and a drain doping part which are provided at respective sides of the channel and doped with an opposite-type doping impurity to the doping impurity doped on the channel. In the exemplary embodiment, the source doping region and the drain doping region correspond to the source electrode and the drain electrode, respectively. The source electrode and the drain electrode provided in the semiconductor 130 may be provided by doping only the corresponding regions. Further, in the semiconductor 130, a region between source electrodes and drain electrodes of different transistors is doped, and thus the source electrode and the drain electrode may be electrically connected to each other.

As illustrated in FIG. 15, the channel 131 includes a driving channel 131a provided in the drive transistor T1, a switching channel 131b provided in the switching transistor T2, a compensation channel 131c provided in the compensation transistor T3, an initialization channel 131d provided in the initialization transistor T4, an operation control channel 131e provided in the operation control transistor T5, a light emission control channel 131f provided in the light emission control transistor T6, and a bypass channel 131g provided in the bypass transistor T7.

The driving transistor T1 includes the driving channel 131a, a driving gate electrode 155a, a driving source electrode 136a, and a driving drain electrode 137a. The driving channel 131a may be curved, and may have a meandering shape or a zigzag shape. As such, by forming the curved driving channel 131a, the driving channel 131a may be provided to be elongated in a narrow space. Accordingly, a driving range of the driving gate-source voltage between the driving gate electrode 155a and the driving source electrode 136a is increased by the elongated driving channel 131a. Since the driving range of the gate voltage is increased, a grayscale of light emitted from the organic light emitting diode OLED may be finely controlled by changing the magnitude of the gate voltage, and as a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a overlaps with the driving channel 131a, and the driving source electrode 136a and the driving drain electrode 137a are provided at respective sides of the driving channel 131a to be close. The driving gate electrode 155a is connected to a driving connecting member 174 through a driving contact hole 61. The driving gate electrode 155a corresponds to the gate metal line, and the driving connecting member 174 corresponds to the data metal line.

The switching transistor T2 includes the switching channel 131b, a switching gate electrode 155b, a switching source electrode 136b, and a switching drain electrode 137b. The switching gate electrode 155b which is part of the portion extending downward from the scan line 151 overlaps the switching channel 131b, and the switching source electrode 136b and the switching drain electrode 137b are provided at respective sides of the switching channel 131b, while being adjacent to each other. The switching source electrode 136b is connected to the data line 171 through a switching contact hole 62.

The compensation transistor T3 includes the compensation channel 131c, a compensation gate electrode 155c, a compensation source electrode 136c, and a compensation drain electrode 137c. The compensation gate electrode 155c that is a part of the scan line 151 is provided as two to prevent a leakage current, and overlaps the compensation channel 131c. The compensation source electrode 136c and the compensation drain electrode 137c are provided to be adjacent to respective sides of the compensation channel 131c. The compensation drain electrode 137c is connected to the driving connecting member 174 through a compensation contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is provided as two to prevent the leakage current, and overlaps the initialization channel 131d. The initialization source electrode 136d and the initialization drain electrode 137d are provided to be adjacent to respective sides of the initialization channel 131d. The initialization source electrode 136d is connected to an initialization connecting member 177 through an initialization contact hole 64.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are provided to be adjacent to respective sides of the operation control channel 131e. The operation control source electrode 136e is connected to a part of the driving voltage line 172 through an operation control contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are provided to be adjacent to respective sides of the light emission control channel 131f The light emission control drain electrode 137f is connected to a pixel connecting member 179 through a light emission control contact hole 66.

The bypass transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are provided to be adjacent to respective sides of the bypass channel 131g.

The bypass source electrode 136g is connected directly to the light emission control drain electrode 137f, and the bypass drain electrode 137g is connected directly to the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 156 via a second gate insulating layer 142 interposed therebetween. The first storage electrode 155a corresponds to the driving gate electrode 155a, and the second storage electrode 156 as the portion extended from a storage line 157 has the wider area than the driving gate electrode 155a and covers the entire driving gate electrode 155a.

Here, the second gate insulating layer 142 includes a dielectric material, and storage capacitance is determined by a charge charged in the storage capacitor Cst and a voltage between both electrodes 155a and 156. As such, the driving gate electrode 155a is used as the first storage electrode 155a, and thus a space in which the storage capacitor may be provided may be secured in a space that is narrowed due to the driving channel 131a occupying a large area within the pixel.

The first storage electrode 155a which is the driving gate electrode 155a is connected to one end of the driving connecting member 174 through the driving contact hole 61 and a storage opening 51. The storage opening 51 is an opening which is provided in the second storage electrode 156. Accordingly, the driving contact hole 61 to connect one end of the driving connecting member 174 and the driving gate electrode 155a is provided inside the storage opening 51. The driving connecting member 174 is provided with the same layer as the data line 171 to be substantially parallel therewith, and the other end of the driving connecting member 174 is connected to the compensation drain electrode 137c of the compensation transistor T3 and the initialization drain electrode 137d of the initialization transistor T4 through the compensation contact hole 63. Accordingly, the driving connecting member 174 connects the driving gate electrode 155a and the compensation drain electrode 137c of the compensation transistor T3 and the initialization drain electrode 137d of the initialization transistor T4 to each other.

The second storage electrode 156 is connected to the driving voltage line 172 through a contact hole 69.

Accordingly, the storage capacitor Cst stores storage capacitance corresponding to a difference between the driving voltage ELVDD transmitted to the second storage electrode 156 through the driving voltage line 172 and the gate voltage Vg of the driving gate electrode 155a.

The pixel connecting member 179 is connected to the pixel electrode 191 through a contact hole 81, and the initialization connecting member 177 is connected to the initialization voltage line 192 through a contact hole 82.

Hereinafter, the cross-sectional structures of the display device according to an exemplary embodiment will be described in detail according to a stacking order with reference to FIGS. 16 and 17.

In this case, since the stacked structures of the operation control transistor T5 is substantially the same as that of the light emission control transistor T6, a detailed description thereof will be omitted.

A buffer layer 120 may be disposed on an insulating substrate 110.

A semiconductor 130 including a channel 131 including a driving channel 131a, a switching channel 131b, a compensation channel 131c, an initialization channel 131d, an operation control channel 131e, a light emission control channel 131f, and a bypass channel 131g is disposed on the buffer layer 120. A driving source electrode 136a and a driving drain electrode 137a are disposed on respective sides of the driving channel 131a in the semiconductor 130, and a switching source electrode 136b and a switching drain electrode 137b are disposed on respective sides of the switching channel 131b. The compensation source electrode 136c and the compensation drain electrode 137c are provided at both sides of the compensation channel 131c, and the initialization source electrode 136d and the initialization drain electrode 137d are provided at both sides of the initialization channel 131d. The operation control source electrode 136e and the operation control drain electrode 137e are provided at both sides of the operation control channel 131e, and the emission control source electrode 136f and the emission control drain electrode 137f are provided at both sides of the emission control channel 131f. The bypass source electrode 136g and the bypass drain electrode 137g are provided at respective sides of the bypass channel 131g.

A first gate insulating layer 141 covering the semiconductor 130 is provided thereon. On the first gate insulating layer 141, a first gate metal line (151, 152, 153, 158, and 155a) including the switching gate electrode 155b, the scan line 151 including the compensation gate electrode 155c, the previous scan line 152 including the initialization gate electrode 155d, the light emission control line 153 including the operation control gate electrode 155e and the light emission control gate electrode 155f, the bypass control line 158 including the bypass gate electrode 155g, and the driving gate electrode (the first storage electrode) 155a is provided.

The second gate insulating layer 142 covering the first gate metal line (151, 152, 153, 158, and 155a) and the first gate insulating layer 141 is disposed thereon. In an exemplary embodiment, the first gate insulating layer 141 and the second gate insulating layer 142 may include a silicon nitride (SiNx) or a silicon oxide (SiOx), for example.

On the second gate insulating layer 142, a second gate metal line (157 and 156) including a storage line 157 parallel to the scan line 151 and the storage electrode 156 as an expansion of the storage line 157 is provided.

The second storage electrode 156 is wider than the first storage electrode 155a functioning as the driving gate electrode such that the second storage electrode 156 completely covers the driving gate electrode 155a.

A gate metal line 151, 152, 153, 155a, 156, and 157 including the first gate metal line (151, 152, 153, and 155a) and the second gate metal line (156 and 157) may be provided as a multilayer in which metal layers including at least one of copper (Cu), a copper alloy, aluminum (Al), an aluminum alloy, molybdenum (Mo), and a molybdenum alloy are stacked.

An interlayer insulating layer 160 is disposed on the second gate insulating layer 142 and the second gate wires 157 and 156. The interlayer insulating layer 160 may include a silicon nitride (SiNx) or a silicon oxide (SiOx).

Contact holes 61, 62, 63, 64, 65, 66, and 69 are defined in the interlayer insulating layer 160. On the interlayer insulating layer 160, a data metal line 171, 172, 174, 177, and 179 including a data line 171, a driving voltage line 172, a driving connecting member 174, an initialization connecting member 177, and a pixel connecting member 179 is provided. The data metal line (171, 172, 174, 177, and 179) may be provided as a multilayer in which metal layers including at least one of copper (Cu), a copper alloy, aluminum (Al), an aluminum alloy, molybdenum (Mo), and a molybdenum alloy are stacked, and for example, may be provided as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 is connected to the switching source electrode 136b through the switching contact hole 62 defined in the first gate insulating layer 141, the second gate insulating layer 142, and the interlayer insulating layer 160, one end of the driving connecting member 174 is connected to the first storage electrode 155a through the driving contact hole 61 defined in the second gate insulating layer 142 and the interlayer insulating layer 160, and the other end of the driving connecting member 174 is connected to the compensation drain electrode 137c and the initialization drain electrode 137d through the compensation contact hole 63 defined in the first gate insulating layer 141, the second gate insulating layer 142, and the interlayer insulating layer 160.

The initialization connecting member 177 parallel to the data line 171 is connected to the initialization source electrode 136d through the initialization contact hole 64 defined in the first gate insulating layer 141, the second gate insulating layer 142, and the interlayer insulating layer 160. Also, the pixel connecting member 179 is connected to the light emission control drain electrode 137f through the light emission control contact hole 66 defined in the first gate insulating layer 141, the second gate insulating layer 142, and the interlayer insulating layer 160.

A passivation layer 180 covering the data metal line 171, 172, 174, 177, and 179 and the interlayer insulating layer 160 is disposed thereon. The passivation layer 180 covers the data metal line (171, 172, 174, 177, and 179) to be flattened such that the pixel electrode 191 may be disposed on the passivation layer 180 without a step. In an exemplary embodiment, the passivation layer 180 may include a stacked layer of an organic material such as a polyacrylate resin, a polyimide resin, or the like, or a stacked layer of an organic material and an inorganic material.

The first electrode 191 and the initialization voltage line 192 are disposed on the passivation layer 180. The pixel connecting member 179 is connected to the first electrode 191 through the contact hole 81 provided in the passivation layer 180, and the initialization connecting member 177 is connected to the initialization voltage line 192 through the contact hole 82 provided in the passivation layer 180.

A pixel definition layer ("PDL") 350 covering the passivation layer 180, the initialization voltage line 192, and the first electrode 191 is disposed thereon. The pixel definition layer 350 includes a first portion 350a, and a second portion 350b, and a pixel opening 351 is defined in the pixel definition layer 350. The second portion 350b of the pixel definition layer 350 has a thickness less than that of the first portion 350a.

The organic emission layer 370 is disposed on the first electrode 191, and the second electrode 270 is disposed on the organic emission layer 370. The second electrode 270 is also disposed on the pixel definition layer 350 over the plurality of pixels PX. As such, the organic light emitting diode OLED including the first electrode 191, the organic emission layer 370, and the second electrode 270 is disposed.

The first electrode 191 includes the first portion 191a overlapping the first portion 350a of the pixel definition layer 350, the second portion 191b overlapping the second portion 350b of the pixel definition layer 350, and the third portion 191c overlapping the pixel opening 351 of the pixel definition layer 350. Here, the overlapping means to be overlapped in a vertical direction in a cross-sectional view.

The second electrode 270 includes the first portion 270a overlapping the first portion 350a of the pixel definition layer 350, the second portion 270b overlapping the second portion 350b of the pixel definition layer 350, and the third portion 270c overlapping the pixel opening 351 of the pixel definition layer 350.

Accordingly, the first electrode 191 and the second electrode 270 overlap the first portion 350a, the second portion 350b, and the pixel opening 351 of the pixel definition layer 350.

The third portion 191c of the first electrode 191 positioned in the pixel opening 351 and the third portion 270c of the second electrode 270 are in contact with the organic emission layer 370. The pixel opening 351 defines a light emission region.

It is shown that the organic emission layer 370 overlaps the second portion 350b of the pixel definition layer 350, but the organic emission layer 370 may not overlap the second portion 350b of the pixel definition layer 350 as described above.

In the illustrated exemplary embodiment, when the thickness of the partial region of the pixel definition layer 350 decreases and the first electrode 191 and the second electrode 270 are overlapped in the corresponding region, the capacitance may be additionally secured.

An encapsulation member (not shown) protecting the organic light emitting diode OLED may be disposed on the second electrode 270, and the encapsulation member may be sealed to the substrate 100 by a sealant and may include various materials such as glass, quartz, ceramic, plastic, and a metal. A thin film encapsulation layer may be disposed on the common electrode 270 by depositing the inorganic layer and the organic layer with the usage of the sealant.

The display device according to an exemplary embodiment will be described with reference to FIG. 18.

Figure 18:
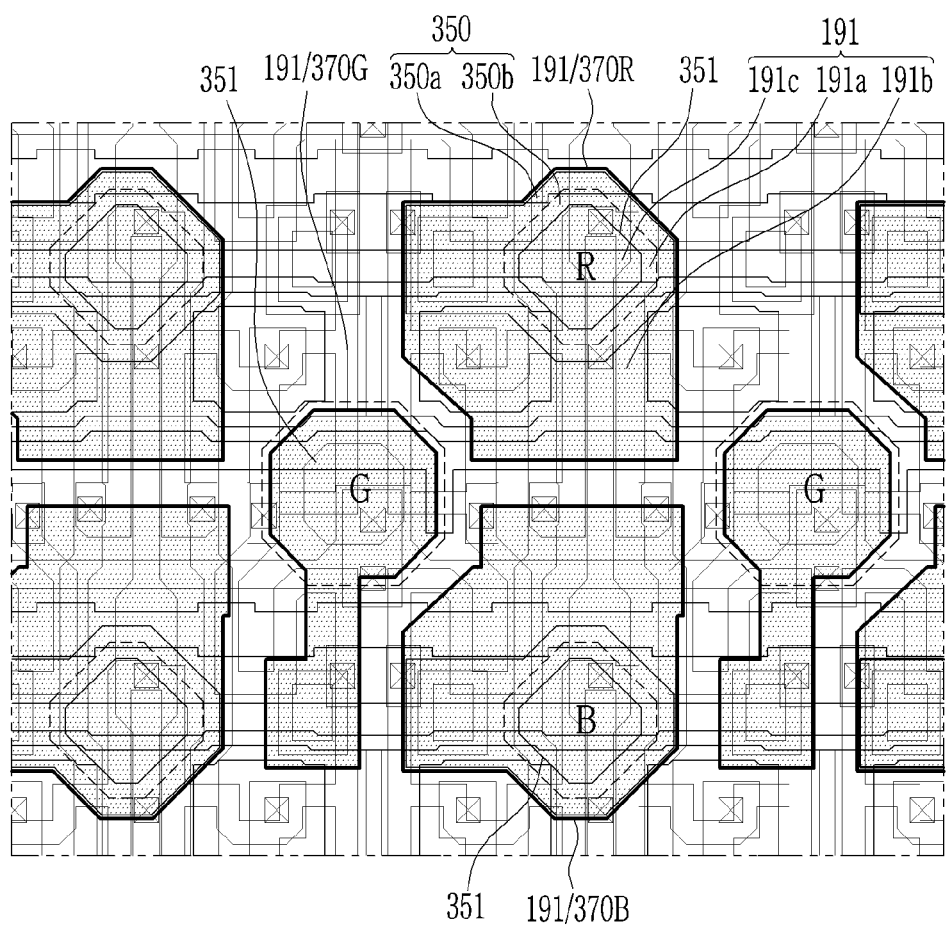
FIG. 18 is a plan view of an exemplary embodiment of a display device.

The display device according to the exemplary embodiment shown in FIG. 18 is substantially the same as the display device according to an exemplary embodiment shown in FIGS. 13 to 17 such that the description thereof is omitted. In the illustrated exemplary embodiment, the plane shape of the first electrode is different from the previous exemplary embodiment, and this is described in detail.

FIG. 18 is a plan view of a display device according to an exemplary embodiment.

Like the previous exemplary embodiment, the display device according to the illustrated exemplary embodiment includes seven transistors, the first electrode 191, the organic emission layer 370, and the second electrode.

The plane shape of the first electrode 191 and the organic emission layer 370 is different from the previous exemplary embodiment, and the plane shape of the first electrode 191 and the organic emission layer 370 may be designed to be variously changed as described above. Also, it is shown that the organic emission layer 370 and the first electrode 191 are completely overlapped, but the invention is not limited thereto, and the organic emission layer 370 and the first electrode 191 may be overlapped at a partial region. Further, the organic emission layer 370 may be positioned only in the pixel opening 351. Like the previous exemplary embodiments, as the second portion 350b of the pixel definition layer 350 is thinner than the first portion 350a and the second portion 350b overlaps the first electrode 191 and the second electrode 270, the capacitance may be additionally secured, thereby improving the reliability of the element.

A plurality of pixels R, G, and B may be disposed as the pentile type, and the first electrode 191 of the red pixel R may be larger than the first electrode 191 positioned in the green pixel G. Also, the first electrode 191 positioned in the blue pixel B may be larger than the first electrode 191 positioned in the green pixel G. The first electrode 191 positioned in the red pixel R and the first electrode 191 positioned in the blue pixel B may be symmetric.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, the method comprising:
   forming a first electrode on a substrate;
   forming an organic material layer on the substrate and the first electrode;
   patterning the organic material layer to form a pixel definition layer including a first portion, a second portion, and a pixel opening enclosed by the first portion;
   forming an organic emission layer on the first electrode; and
   forming a second electrode on the organic emission layer,
   wherein the second portion is thinner than the first portion, and
   the first portion defines the pixel opening,
   wherein the first portion is elevated more than the second portion from the first electrode, and
   the first portion of the pixel definition layer is disposed between the pixel opening and the second portion.

2. The method of claim 1, wherein
at least one of a slit mask and a half-tone mask is used in the patterning the organic material layer.

3. The method of claim 1, wherein
the first electrode and the second electrode overlap the first portion, the second portion, and the pixel opening of the pixel definition layer.

4. The method of claim 3, wherein
a distance between a first portion of the first electrode overlapping the first portion of the pixel definition layer and a first portion of the second electrode is greater than a distance between a second portion of the first electrode overlapping the second portion of the pixel definition layer and a second portion of the second electrode.

5. The method of claim 1, wherein
the second portion of the pixel definition layer further overlaps the organic emission layer.

* * * * *